(12) United States Patent
Yu et al.

(10) Patent No.: US 11,387,140 B2
(45) Date of Patent: Jul. 12, 2022

(54) ENLARGING CONTACT AREA AND PROCESS WINDOW FOR A CONTACT VIA

(71) Applicant: Taiwan Semiconductor Manufacturing Co., Ltd., Hsin-Chu (TW)

(72) Inventors: Li-Zhen Yu, New Taipei (TW); Cheng-Chi Chuang, New Taipei (TW); Chih-Hao Wang, Baoshan Township (TW); Yu-Ming Lin, Hsinchu (TW); Lin-Yu Huang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 116 days.

(21) Appl. No.: 16/822,383

(22) Filed: Mar. 18, 2020

(65) Prior Publication Data
US 2021/0296162 A1 Sep. 23, 2021

(51) Int. Cl.
*H01L 23/522* (2006.01)
*H01L 23/532* (2006.01)
*H01L 21/768* (2006.01)
*H01L 21/8234* (2006.01)
*H01L 21/033* (2006.01)
*H01L 21/311* (2006.01)
*H01L 23/528* (2006.01)

(52) U.S. Cl.
CPC .... *H01L 21/76802* (2013.01); *H01L 21/0332* (2013.01); *H01L 21/0337* (2013.01); *H01L 21/31111* (2013.01); *H01L 21/31144* (2013.01); *H01L 21/76877* (2013.01); *H01L 21/823437* (2013.01); *H01L 21/823475* (2013.01); *H01L 23/5226* (2013.01); *H01L 23/5283* (2013.01); *H01L 23/53295* (2013.01)

(58) Field of Classification Search
CPC .......... H01L 21/76802; H01L 21/0332; H01L 21/0337; H01L 21/31111; H01L 21/31144; H01L 21/76877; H01L 21/823437; H01L 21/823475; H01L 23/5226; H01L 23/5283; H01L 23/53295; H01L 27/088
USPC ....................................................... 257/368
See application file for complete search history.

(56) References Cited

U.S. PATENT DOCUMENTS

2020/0176309 A1* 6/2020 Chen ................. H01L 21/76825
2021/0091194 A1* 3/2021 Hourani ............ H01L 21/76834

OTHER PUBLICATIONS

Ruzyllo, Jerzy. "Semiconductor OneSource: Semiconductor Glossary." Published in 2016.

* cited by examiner

*Primary Examiner* — Caleen O Sullivan
(74) *Attorney, Agent, or Firm* — Eschweiler & Potashnik, LLC

(57) ABSTRACT

In some embodiments, the present disclosure relates to an integrated chip that includes a substrate and a gate electrode overlying the substrate. Further, the integrated chip includes a contact layer overlies the substrate and is laterally spaced apart from the gate electrode by a spacer structure. The spacer structure may surround outermost sidewalls of the gate electrode. A hard mask structure may be arranged over the gate electrode and between portions of the spacer structure. A contact via extends through the hard mask structure and contacts the gate electrode. The integrated chip may further include a liner layer that is arranged directly between the hard mask structure and the spacer structure, wherein the liner layer is spaced apart from the gate electrode.

20 Claims, 26 Drawing Sheets

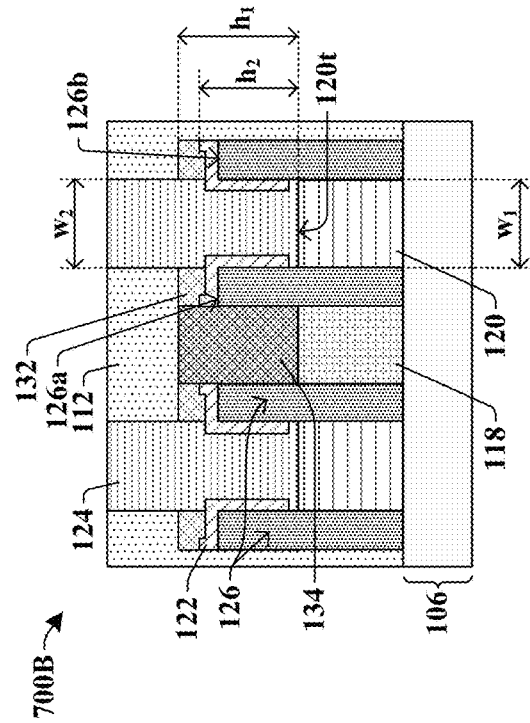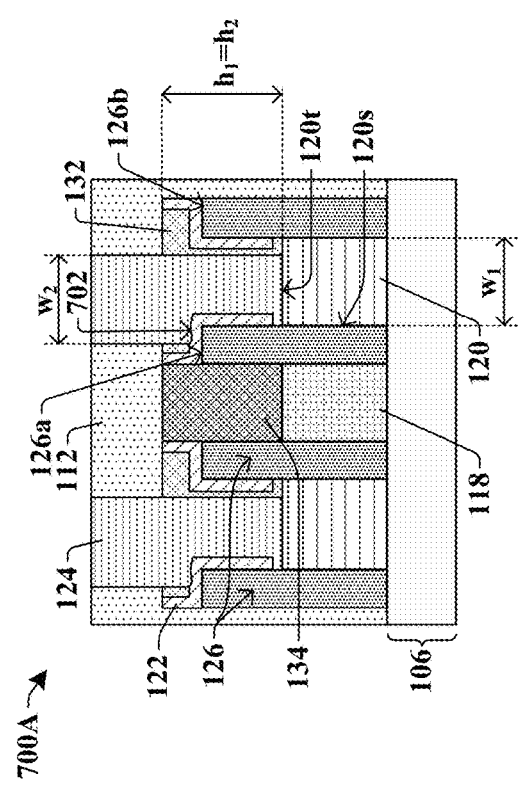
Fig. 7A
Fig. 7B
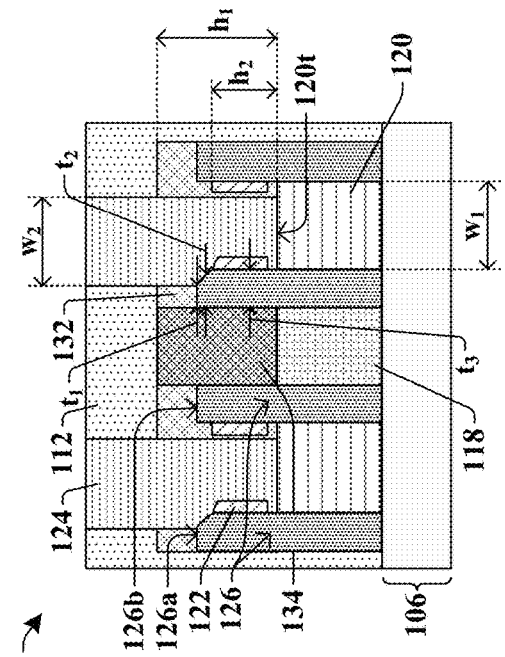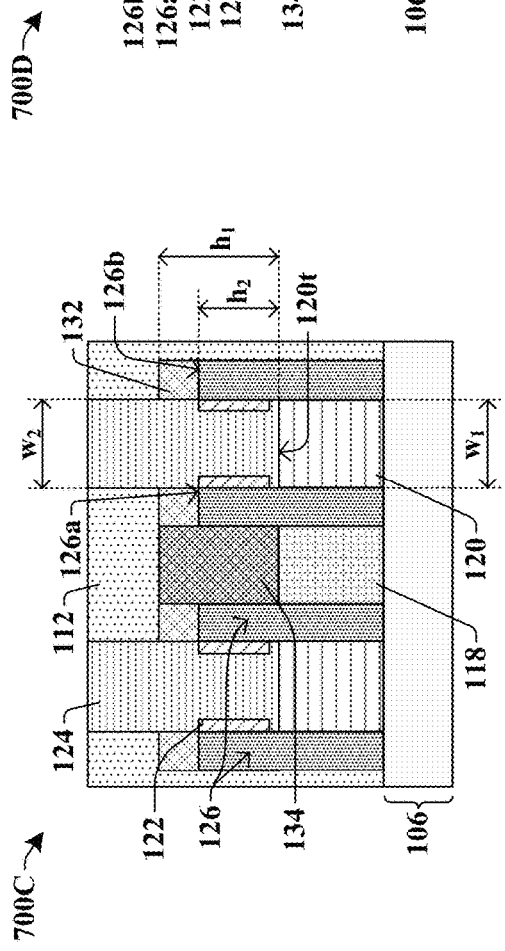
Fig. 7C
Fig. 7D

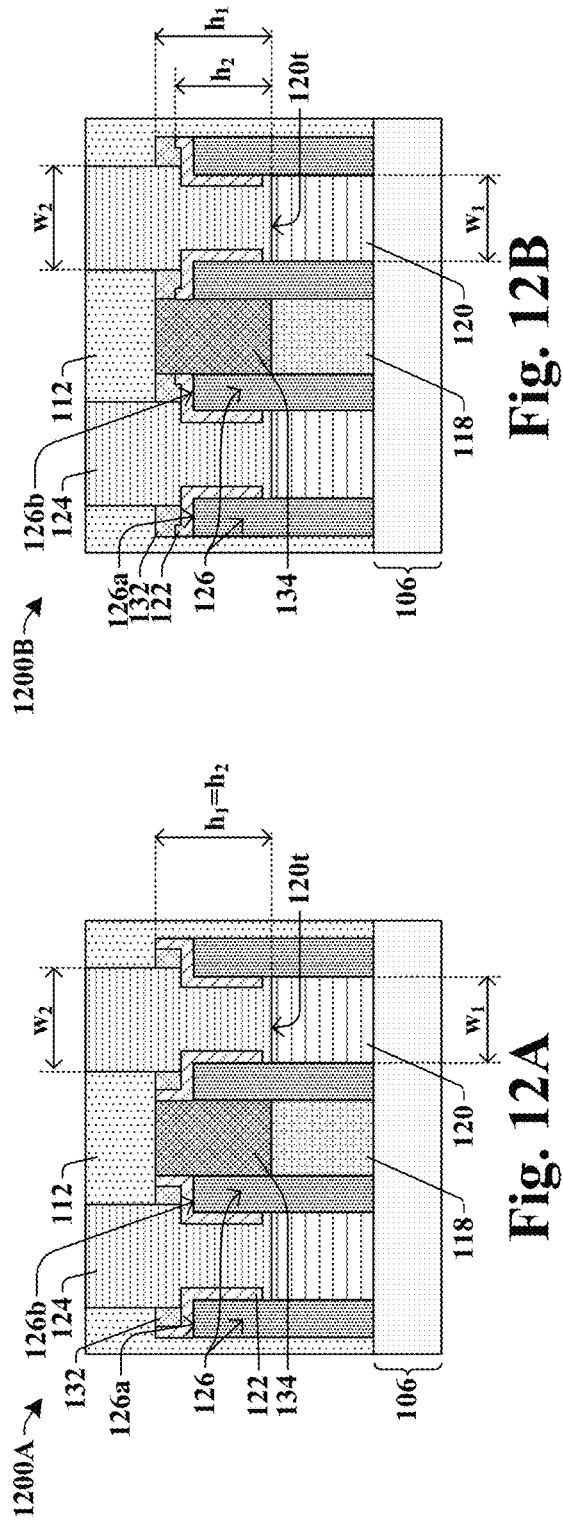

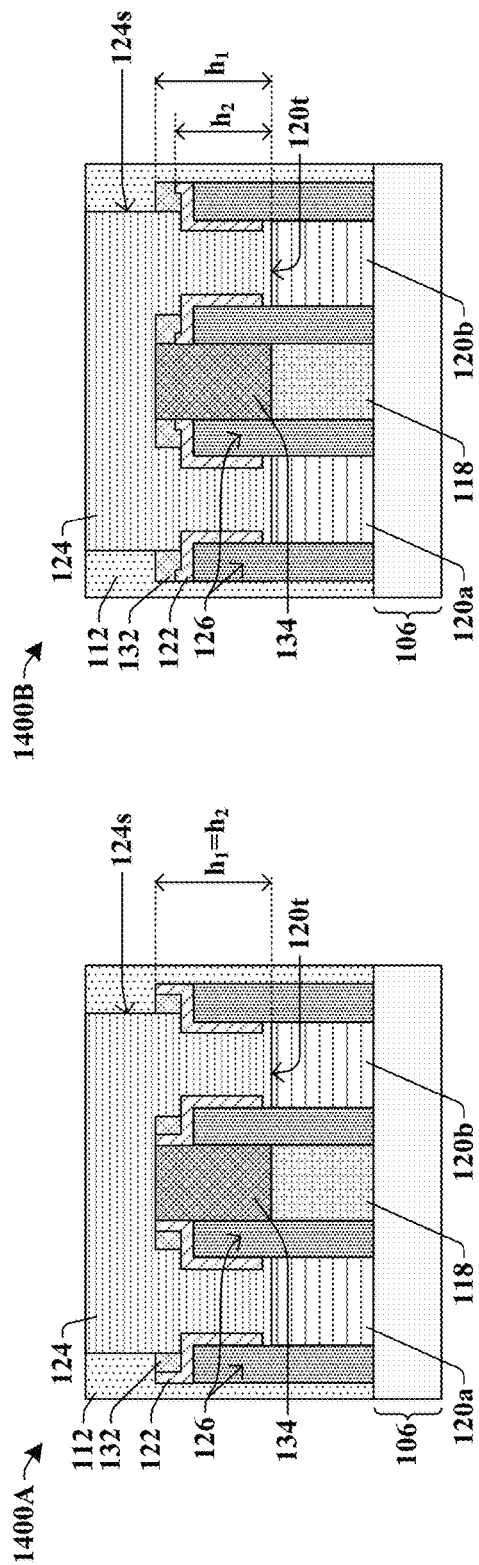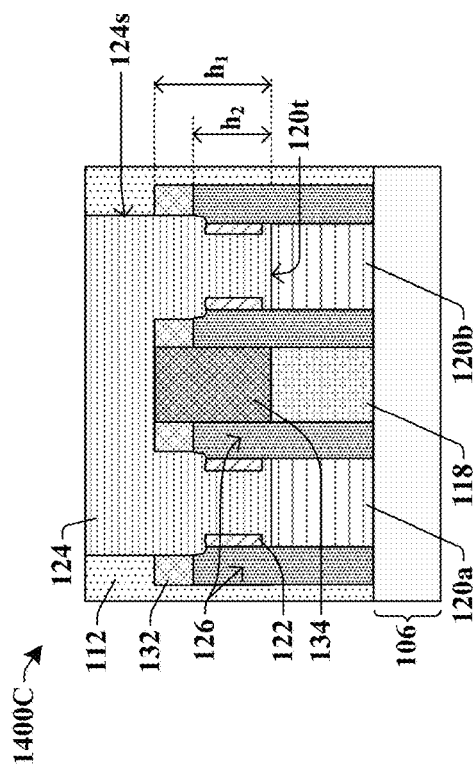
Fig. 14A
Fig. 14B
Fig. 14C

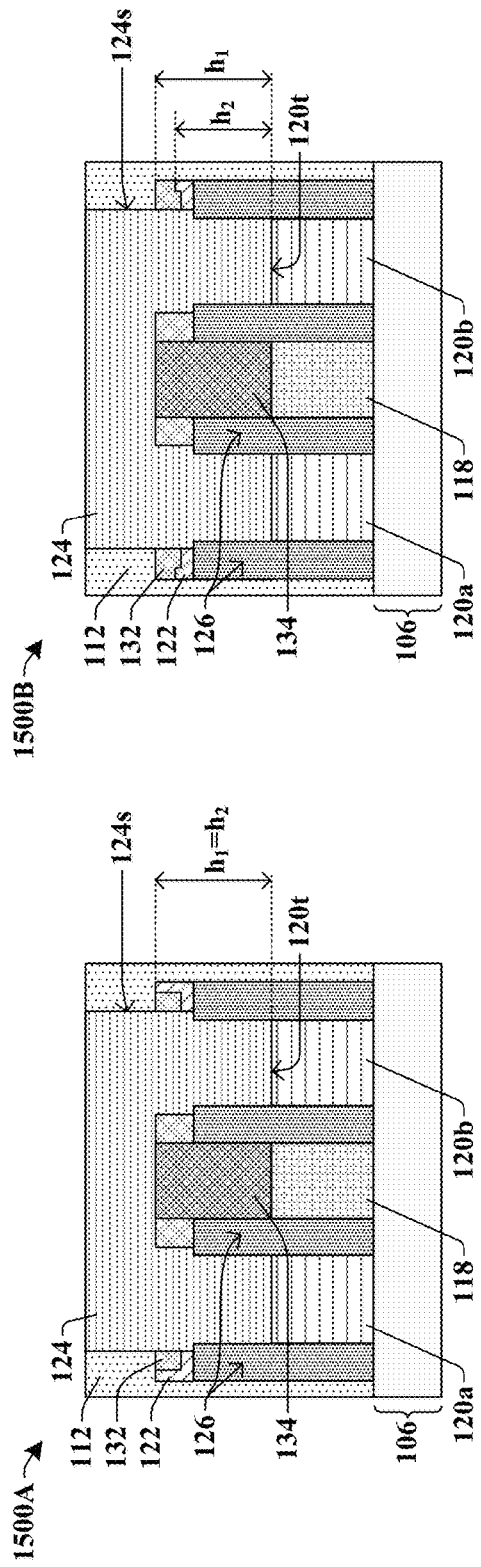
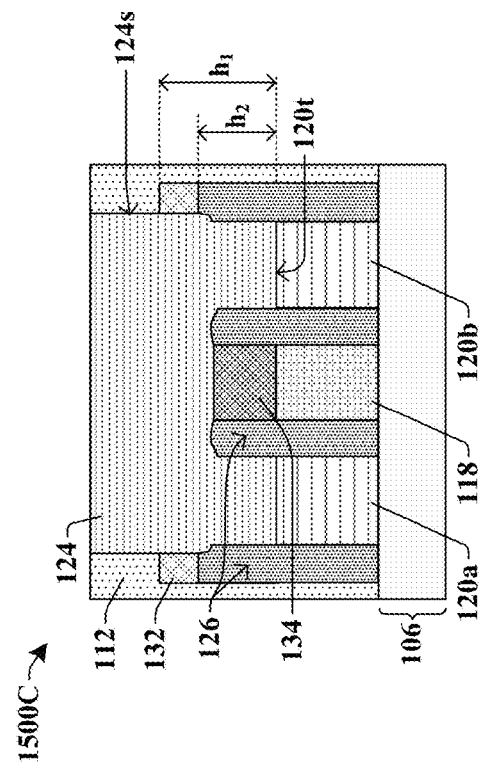
Fig. 15A
Fig. 15B
Fig. 15C

ENLARGING CONTACT AREA AND PROCESS WINDOW FOR A CONTACT VIA

BACKGROUND

The integrated chip manufacturing industry has experienced exponential growth over the last few decades. As integrated chips have evolved, functional density (e.g., the number of semiconductor devices per chip area) has increased while feature sizes have decreased. As feature sizes decrease, there is an increase in interference amongst the features. To mitigate interference amongst the features of the semiconductor devices, manufacturing techniques and/or features for isolation in ICs are being researched.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 7A-15C illustrate cross-sectional views of some additional embodiments of an integrated chip comprising a liner layer arranged over a gate electrode.

DETAILED DESCRIPTION

Figure 1A:
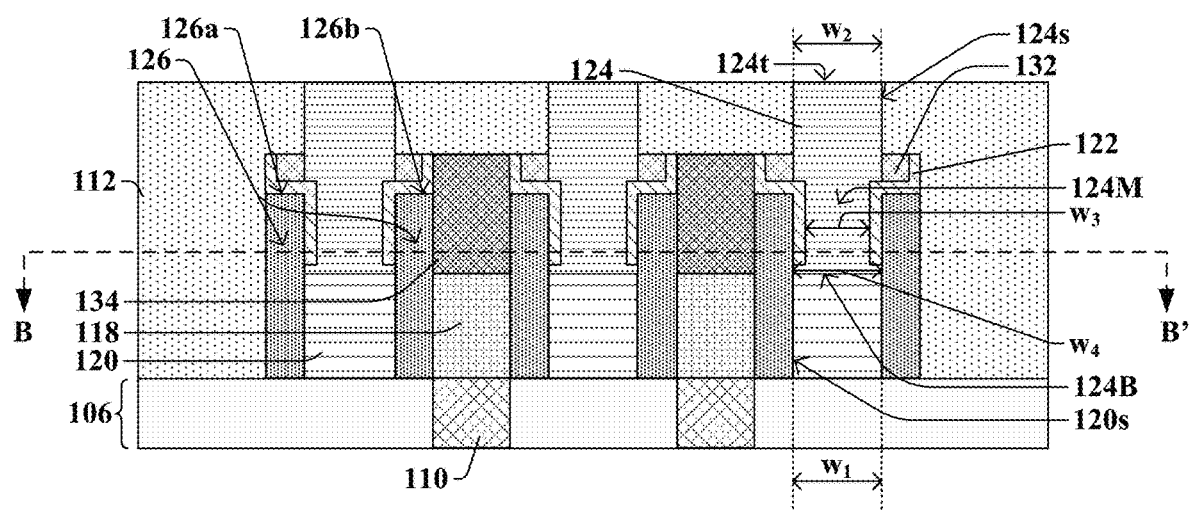
FIG. 1A-C illustrate various views of some embodiments of an integrated chip comprising a liner layer arranged between a spacer structure and a contact via and arranged over a gate electrode.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, an integrated chip comprises a transistor having a contact layer over a source/drain region of a substrate. A channel region may be arranged beside the source/drain region of the substrate, and a gate electrode may be arranged over the channel region. A contact via may be arranged over the gate electrode. In some embodiments, a spacer structure electrically isolates the contact layer from the gate electrode and the contact via.

In some embodiments, a process for forming the contact via comprises: 1) forming a hard mask structure over the gate electrode, the spacer structure, and the contact layer; 2) forming a masking structure over the hard mask structure, wherein the masking structure has a first opening that directly overlies the gate electrode; 3) performing an etching process to remove the hard mask structure directly below the first opening to expose the gate electrode; and 4) depositing a conductive material over the gate electrode to form the contact via.

As dimensions of the features (e.g., gate electrode, contact layer, spacer structure, contact via, etc.) decrease in size, the degree of dimension and overlay control of the masking structure and first opening becomes more difficult. A process window (e.g., a resiliency) of the etching process is small at emerging process nodes. Failing to attain the high degrees of dimension and overlay control may lead to improper coupling between devices, device failure, high leakage current, or any combination of the foregoing. For example, a challenge with the aforementioned process is to prevent the first opening in the masking structure from directly overlying the spacer structure. If the spacer structure is exposed to the etching process, portions of the spacer structure may be removed by the etching process. When portions of the spacer structure are removed, isolation between the contact layer and the contact via and the gate electrode is poor, and interference between the contact via and the contact layer decreases device reliability.

Various embodiments of the present disclosure are directed to the insertion of a liner layer over the spacer structure to mitigate removal of the spacer structure if exposed to the etching process. The liner layer may comprise a material that is more resistant to removal by the etching process than materials of the spacer structure. Thus, the liner layer prevents the etching process from removing the spacer structure and/or reduces the amount of time the spacer structure is exposed to the etching process. Further, a sacrificial layer is used during processing to prevent the liner layer from being in direct contact with the gate electrode in order to increase the contact area between the contact via and the gate electrode to reduce contact resistance. Therefore, the liner layer reduces the loss of the spacer structure during the etching process to maintain reliable isolation of the gate electrode and the contact via by the spacer structure without increasing the contact resistance between the contact via and the gate electrode.

FIG. 1A illustrates a cross-sectional view 100A of an integrated chip comprising a contact via between a liner layer and a gate electrode.

The integrated chip comprises a substrate 106 comprising a source/drain region 110. The source/drain region 110 may comprise a different doping type than the substrate 106. A contact layer 118 may be arranged above the source/drain region 110, and a gate electrode 120 may be arranged laterally beside the contact layer 118 and separated from the contact layer 118 by a spacer structure 126. The contact layer 118 and the gate electrode 120 may comprise conductive materials, whereas the spacer structure 126 may comprise an insulator material, such as, for example a low-k dielectric like silicon dioxide or silicon nitride. The spacer structure 126 surrounds outermost sidewalls 120s of the gate electrode 120 and electrically isolates the contact layer 118 from the gate electrode 120. In some embodiments, the gate electrode 120 and the contact layer 118 may be a part of a transistor, wherein the transistor may be or comprise a metal oxide semiconductor field effect transistor (MOSFET), a fin field effect transistor (finFET), a gate all around field effect transistor (GAAFET), or some other field effect transistor (FET).

In some embodiments, a first hard mask structure 132 is arranged over the gate electrode 120, and a second hard mask structure 134 is arranged over the contact layer 118. The first and/or second hard mask structures 132, 134 may comprise a low-k dielectric material such as, for example, silicon dioxide or silicon nitride. A dielectric structure 112 may overlie the first and second hard mask structures 132, 134, in some embodiments.

A contact via 124 may be arranged over and coupled to the gate electrode 120. In some embodiments, the contact via 124 extends through the first hard mask structure 132 to directly contact the gate electrode 120. The spacer structure 126 may also separate the contact layer 118 from the contact via 124. In some embodiments, the gate electrode 120 may have a first width $w_1$ that is a maximum width of the gate electrode 120, and the contact via 124 may have a varying width. For example, in some embodiments, a topmost surface 124t of the contact via 124 has a second width $w_2$; a middle portion 124M of the contact via 124 has a third width $w_3$; and a bottom portion 124B of the contact via 124 has a fourth width $w_4$. In some embodiments, the third width $w_3$ is less than the fourth width $w_4$ and is less than the second width $w_2$. In some embodiments, the fourth width $w_4$ is about equal to the first width $w_1$. Further in some embodiments, the first width $w_1$ may also be about equal to the second width $w_2$.

In some embodiments, the contact via 124 does "land centered" over the gate electrode 120. For example, an outermost sidewall 124s of the contact via 124 may directly overlie the gate electrode 120 or directly overlie an outermost sidewall 120s of the gate electrode 120. In other words, in some embodiments, wherein the contact via 124 has a second width $w_2$ about equal to the first width $w_1$ of the gate electrode 120, "land centered" may mean that the contact via 124 does not directly overlie the spacer structure 126. Thus, during manufacturing of the contact via 124, the spacer structure 126 may not be exposed to etchants from removal of the first hard mask structure 132 in order to form the contact via 124 over the gate electrode 120. In such embodiments, the spacer structure 126 may have a substantially uniform thickness throughout its height.

In some embodiments, a liner layer 122 may be arranged between the first hard mask structure 132 and the spacer structure 126. In some embodiments, the liner layer 122 completely covers first and second topmost surfaces 126a, 126b of the spacer structure 126, and covers portions of inner sidewalls of the spacer structure 126. The liner layer 122 comprises a different material than the first hard mask structure 132 and the spacer structure 126. In some embodiments, the liner layer 122 comprises a material that has a higher dielectric constant than the first hard mask structure 132 and the spacer structure 126. For example, in some embodiments, the liner layer 122 comprises a metal oxide (e.g., hafnium oxide, zinc oxide, tantalum oxide, titanium dioxide, etc.).

Thus, the liner layer 122 comprises a material that has a slower etching rate of removal by a first etchant than the first hard mask structure 132. For example, in some embodiments, the first etchant is used during the formation of the contact via 124 to remove portions of the first hard mask structure 132 to expose the gate electrode 120. In such embodiments, the liner layer 122 has a slower rate of removal by the first etchant than the first hard mask structure 132 in order to protect the spacer structure 126 from possible exposure and subsequent removal by the first etchant. Thus, because of the liner layer 122, in some embodiments, even if the contact via 124 does not "land centered" on the gate electrode 120, the spacer structure 126 may be protected during processing to provide sufficient isolation between the contact via 124 and the contact layer 118.

Further, in some embodiments, the liner layer 122 does not directly contact the gate electrode 120. In such embodiments, the contact via 124 may be arranged directly between the liner layer 122 and the gate electrode 120. Because the liner layer 122 does not directly contact the gate electrode 120, the contact area between the contact via 124 and the gate electrode 120 may be optimized, thereby decreasing contact resistance between the gate electrode 120 and the contact via 124.

Figure 1B:
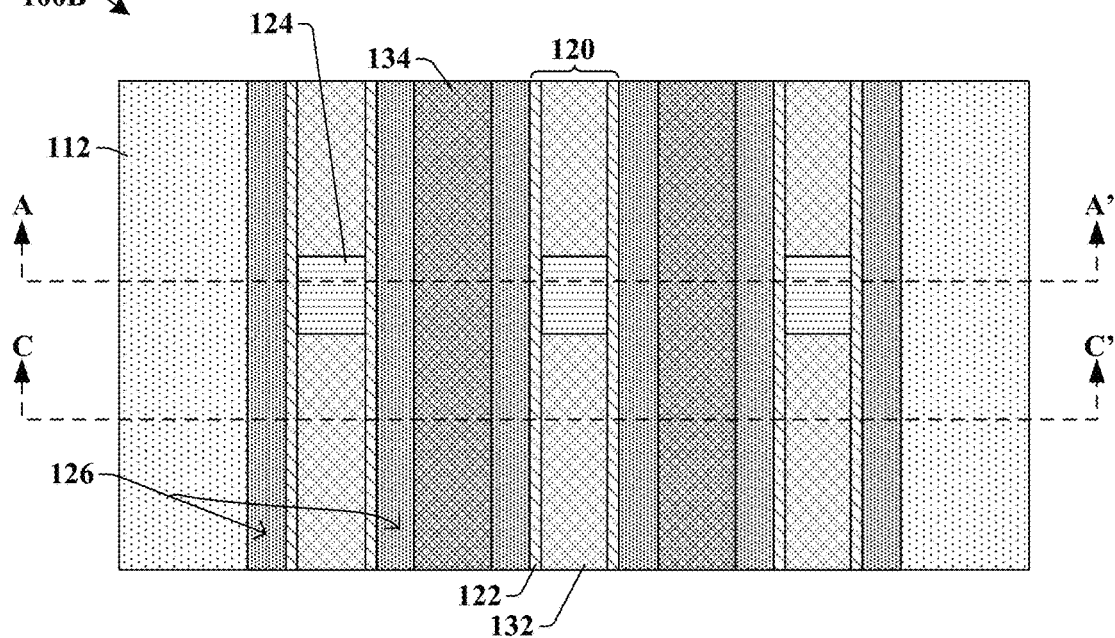

FIG. 1B illustrates a top-view 100B of some embodiments corresponding to cross-section line BB' of FIG. 1A. Cross-section line AA' of FIG. 1B may correspond to the cross-sectional view 100A of FIG. 1A.

As illustrated in the top-view 100B, in some embodiments, the gate electrode 120 is arranged directly below the first hard mask structure 132 and the liner layer 122, and extends in a first direction. The spacer structure 126 and the second hard mask structure 134 may also extend in the first direction and be parallel to the gate electrode 120. In some embodiments, from the top-view 100B, the liner layer 122 may separate the spacer structure 126 from the first hard mask structure 132. In some embodiments, the contact via 124 directly overlies a portion of the gate electrode 120 and is spaced apart from the spacer structure 126 by the liner layer 122. In some embodiments, from the top-view 100B, the contact via 124 may resemble a polygon-like shape such as, for example, a square or rectangle. In other embodiments, from the top-view 100B, the contact via 124 may resemble other shapes such as a circle or an oval, for example.

Figure 1C:
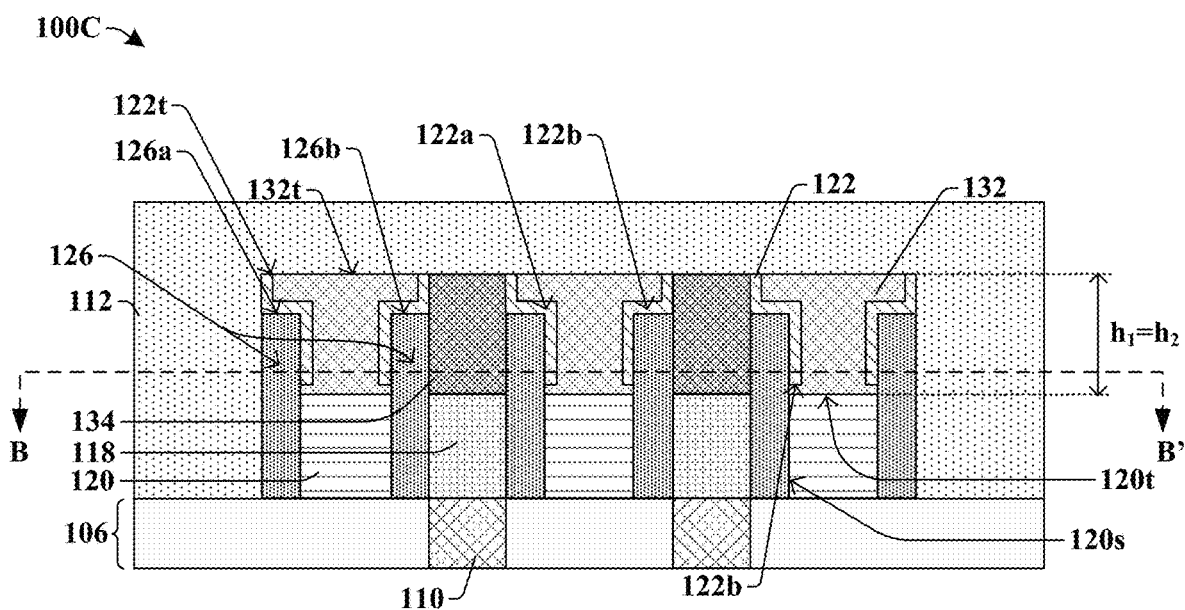

FIG. 1C illustrates a cross-sectional view 100C of some embodiments corresponding to cross-section line CC' of FIG. 1B. Cross-section line BB' of FIG. 1C may correspond to the top-view 100B of FIG. 1B.

As illustrated in the cross-sectional view 100C, the liner layer 122 separates portions of the first hard mask structure 132 from the spacer structure 126. The liner layer 122 is spaced apart from the gate electrode 120 by the first hard mask structure 132. In some embodiments, a first portion 122a of the liner layer 122 is arranged on a first side of the first hard mask structure 132, and a second portion 122b of the liner layer 122 is arranged on a second side of the first hard mask structure 132. The first portion 122a is completely spaced apart from the second portion 122b. In some embodiments, bottom surfaces of the first and second portions 122a, 122b of the liner layer 122 are separated from the gate electrode 120 by the first hard mask structure 132. In other embodiments, from cross-sectional view 100A of FIG. 1A, for example, bottom surfaces of the first and second portions 122a, 122b of the liner layer 122 are separated from the gate electrode 120 by the contact via (124 of FIG. 1A).

In some embodiments, the liner layer 122 has a topmost surface 122t that is at about a same height as a topmost surface 132t of the first hard mask structure 132. For example, the topmost surface 132t of the first hard mask structure 132 may be at a first height $h_1$ measured from a topmost surface 120t of the gate electrode 120 in a vertical direction, and the topmost surface 132t of the first hard mask structure 132 may be at a second height $h_2$ measured from a topmost surface 120t of the gate electrode 120 in the vertical direction. The vertical direction may be normal to the topmost surface 120t of the gate electrode 120. In some embodiments, the first height $h_1$ equals the second height $h_2$. Further, the topmost surface 132t of the first hard mask structure 132 is above the first and second topmost surfaces 126a, 126b of the spacer structure 126, and thus, in some embodiments, the liner layer 122 has a topmost surface 122t that is above the first and second topmost surfaces 126a, 126b of the spacer structure 126.

Figure 2:
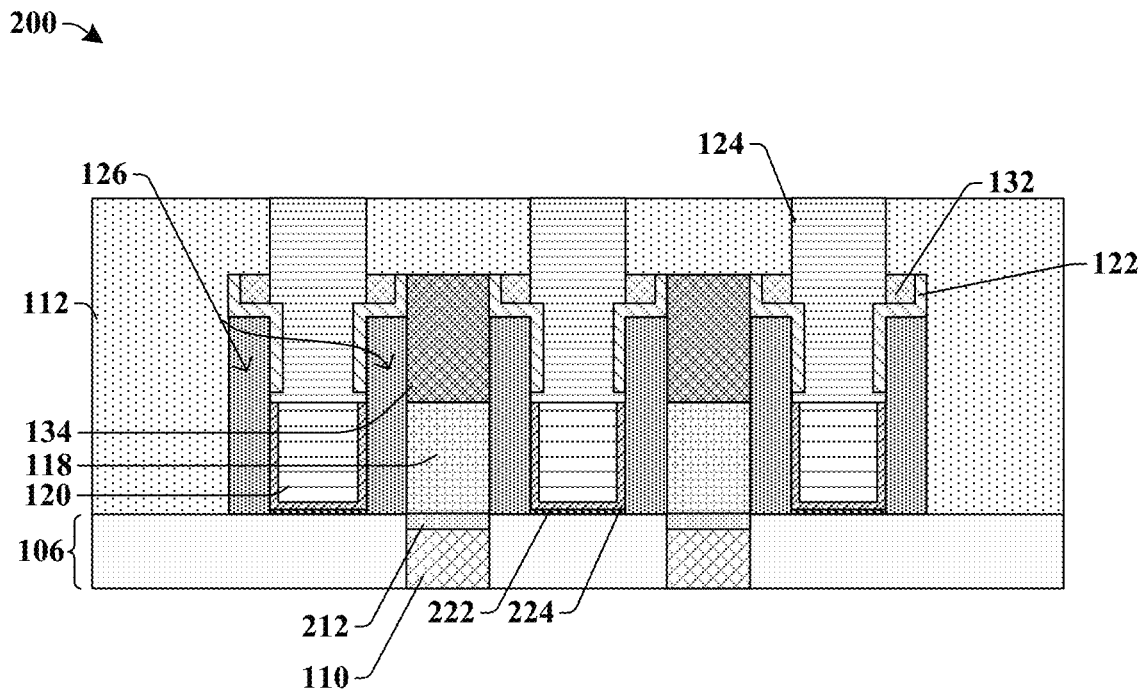
FIG. 2 illustrates a cross-sectional view of some additional embodiments of an integrated chip comprising a liner layer arranged between a spacer structure and a contact via and arranged over a gate electrode.

FIG. 2 illustrates a cross-sectional view 200 of some other embodiments of an integrated chip comprising a liner layer over a gate electrode.

In some embodiments, a silicide layer 212 is arranged over the source/drain region 110. Thus, in some embodiments, the contact layer 118 directly contacts the silicide layer 212. Further, in some embodiments, a gate dielectric layer 224 surrounds outer sidewalls and a lower surface of the gate electrode 120. The gate dielectric layer 224 may comprise a high-k dielectric, in some embodiments. Further, in some embodiments, an interfacial layer 222 is arranged between the gate dielectric layer 224 and the substrate 106. In some embodiments, the interfacial layer 222 may comprise silicon dioxide, for example.

Figure 3:
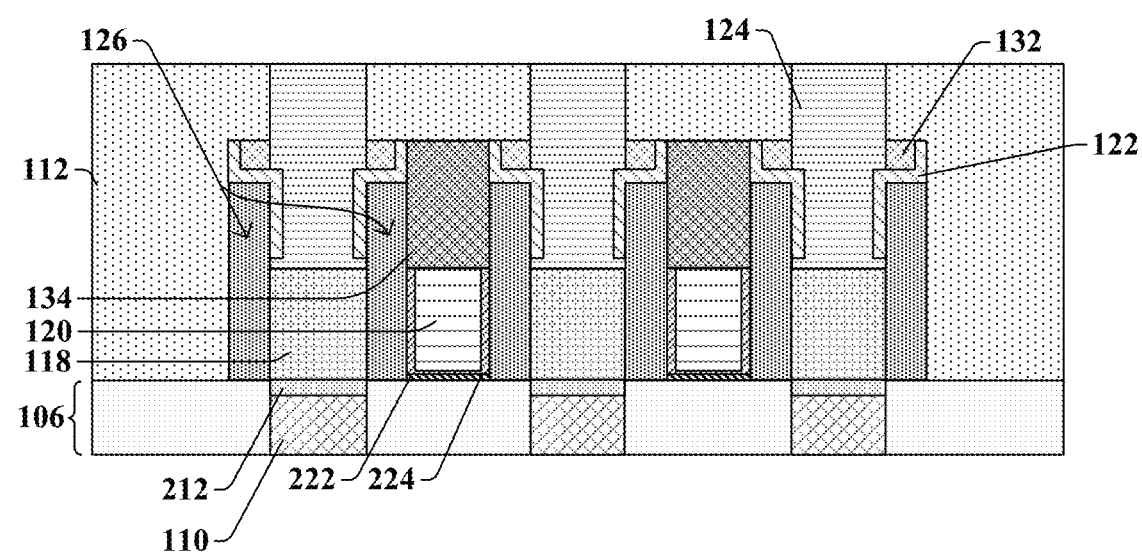
FIG. 3 illustrates a cross-sectional view of some embodiments of an integrated chip comprising a liner layer arranged between a spacer structure and a contact via and arranged over a contact layer.

FIG. 3 illustrates a cross-sectional view 300 of some alternative embodiments of an integrated chip comprising a liner layer arranged over a spacer structure.

In some embodiments, as in the cross-sectional view 300 of FIG. 3, the contact via 124 is arranged over and directly contacts the contact layer 118. Further, in some embodiments, the liner layer 122 is arranged over the contact layer 118 and between the first hard mask structure 132 and the spacer structure 126. Thus, if the first hard mask structure 132 is arranged over the contact layer 118, and portions of the first hard mask structure 132 are removed to form the contact via 124 on the contact layer 118, the liner layer 122 may protect the spacer structure 126 surrounding the contact layer 118.

It will be appreciated that the liner layer 122 and the spacer structure 126 in FIG. 3 may exhibit same or similar characteristics (e.g., material, thickness, etc.) as the various embodiments illustrated in FIGS. 1A-C, 2, and 4A-15C, except that the liner layer 122, the contact via 124, and the first hard mask structure 132 may be arranged over the contact layer 118 instead of over the gate electrode 120. Nevertheless, in some embodiments, the liner layer 122 protects the spacer structure 126 during formation of the contact via 124 such that the spacer structure 126 effectively isolates the gate electrode 120, the contact layer 118, and/or the contact via 124 from one another.

Figure 4A:
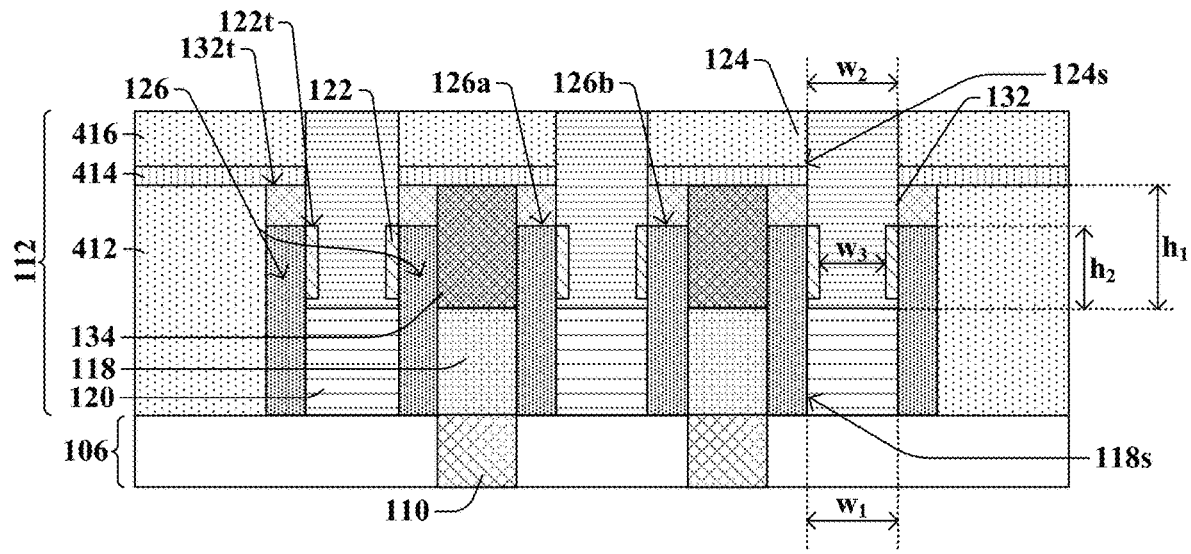
FIG. 4A illustrates a cross-sectional view of some additional embodiments of an integrated chip comprising a liner layer arranged between a spacer structure and a contact via and arranged over a gate electrode, wherein the contact via is substantially centered over the gate electrode.

FIG. 4A illustrates a cross-sectional view 400A of some alternative embodiments of an integrated chip comprising a liner layer arranged over a spacer structure and a gate electrode.

In some embodiments, the dielectric structure 112 comprises a first dielectric layer 412, an etch stop layer 414, and a second dielectric layer 416. In some embodiments, the etch stop layer 414 is arranged over and directly contacts the first and second hard mask structures 132, 134. In some embodiments, the etch stop layer 414 may comprise, for example, silicon oxide, hafnium silicon, silicon oxygen carbide, aluminum oxide, zirconium silicon, aluminum oxygen nitride, zirconium oxide, tantalum oxide, lanthanum oxide, yttrium oxide, tantalum carbon nitride, silicon nitride, silicon oxygen carbon nitride, silicon, zirconium nitride, silicon carbon nitride, or the like. The first dielectric layer 412 and/or the second dielectric layer 416 may each comprise, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like.

Figure 4B:
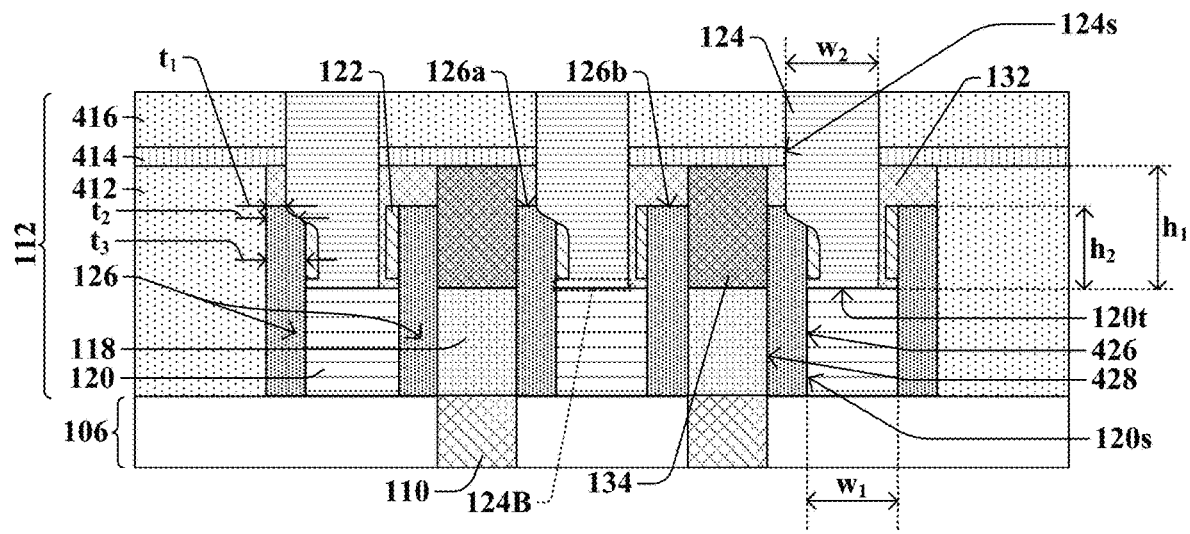
FIG. 4B illustrates a cross-sectional view of some embodiments of an integrated chip comprising a liner layer arranged between a spacer structure and a contact via and arranged over a gate electrode, wherein the contact via is not substantially centered over the gate electrode.

Further, in some embodiments, the topmost surface 122t of the liner layer 122 may be below the topmost surface 132t of the first hard mask structure 132. In some embodiments, the topmost surface 122t of the liner layer 122 may be about even with (e.g., not above and not below) the first and second topmost surfaces 126a, 126b of the spacer structure 126. Thus, in some embodiments, the second height $h_2$ of the liner layer 122 may be less than the first height $h_1$ of the first hard mask structure 132. The second height $h_2$ of the liner layer 122 may be less than the first height $h_1$ to reduce the capacitance of the final device. However, when the first and second topmost surfaces 126a, 126b of the spacer structure 126 are not covered by the liner layer 122, the first and second topmost surfaces 126a, 126b of the spacer structure 126 may experience damage (e.g., increase in surface roughness, defects from ion bombardment, etc.) and more loss from a longer exposure to the first etchant than in embodiments where the liner layer 122 covers the first and second topmost surfaces 126a, 126b of the spacer structure 126, as depicted in FIG. 4B. In some embodiments, a ratio between the second height $h_2$ of the liner layer 122 to the first height $h_1$ of the first hard mask structure 132 may be in a range of between, for example, approximately 10 percent and approximately 100 percent.

FIG. 4B illustrates a cross-sectional view 400B of some alternative embodiments of the structure of FIG. 4A, wherein the contact via 124 does not "land centered" over the gate electrode 120.

In some embodiments, although the first width $w_1$ of the gate electrode 120 may be about equal to the second width $w_2$ of the contact via 124, the contact via 124 may not "land centered" over the gate electrode 120 during manufacturing, due to, for example, a small processing window. Thus, the contact via 124 may directly overlie the spacer structure 126. Further, in such embodiments, the liner layer 122 may not cover the first and second topmost surfaces 126a, 126b of the spacer structure 126, and consequently, portions of the spacer structure 126 may be removed during manufacturing of the contact via 124. Thus, in some embodiments, the spacer structure 126 may have a varying thickness between a first inner sidewall 426 and a first outer sidewall 428 throughout a height of the spacer structure 126. For example, in some embodiments, a first topmost surface 126a of the spacer structure 126 may have a first thickness $t_1$, the spacer structure 126 may have a second thickness $t_2$ that is greater than the first thickness $t_1$ at a first location below the first topmost surface 126a of the spacer structure 126, and the spacer structure 126 may have a third thickness $t_3$ that is greater than the second thickness $t_2$. In some embodiments, the third thickness $t_3$ may be a maximum thickness of the spacer structure 126. In some embodiments, the first thickness $t_1$ may be a minimum thickness of the spacer structure 126. The first through third thicknesses $t_{1-3}$ may each be measured from the first inner sidewall 426 to the first outer sidewall 428 in a lateral direction that is substantially perpendicular to the vertical direction. The third thickness $t_3$ may be measured at a second location that is above the topmost surface 120t of the gate electrode 120 and below the first location. Thus, the liner layer 122 may prevent the third thickness $t_3$ (e.g., maximum thickness) of the spacer structure 126 from being below the topmost surface 120t of the gate electrode 120, thereby allowing the spacer structure 126 to isolate the contact via 124 and the gate electrode 120 from the contact layer 118. If the spacer structure 126 had a reduction in thickness at a location below the topmost surface 120t of the gate electrode 120, the spacer structure 126 may be too thin to provide sufficient isolation.

Figure 5A:
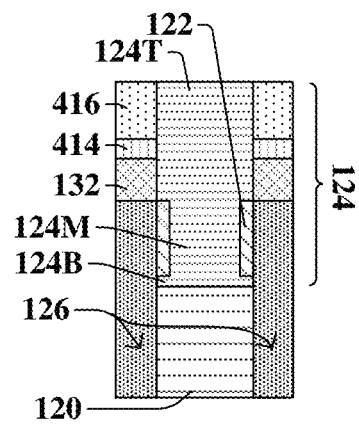
FIGS. 5A and 5B illustrate cross-sectional views of comprising a contact via arranged over a gate electrode, wherein the contact via comprises one or more materials.

FIG. 5A illustrates a cross-sectional view 500A of some embodiments of a contact via separated from a spacer structure by a liner layer.

In some embodiments, the contact via 124 comprises a top portion 124T arranged above the spacer structure 126, a middle portion 124M arranged directly between the liner layer 122 and the spacer structure 126, and a bottom portion 124B arranged directly over the gate electrode 120 and having outermost sidewalls directly contacting the spacer structure 126. In such embodiments, the middle portion 124M of the contact via 124 may have the smallest width compared to the top portion 124T and the bottom portion 124B of the contact via 124. The middle portion 124M is arranged between the top portion 124T and the bottom portion 124B. In some embodiments, the top portion 124T, the middle portion 124M, and the bottom portion 124B of the contact via 124 comprises a same material. In some embodiments, the contact via 124 comprises tungsten, ruthenium, cobalt, copper, titanium, titanium nitride, tantalum, tantalum nitride, molybdenum, nickel, or a combination thereof.

Figure 5B:
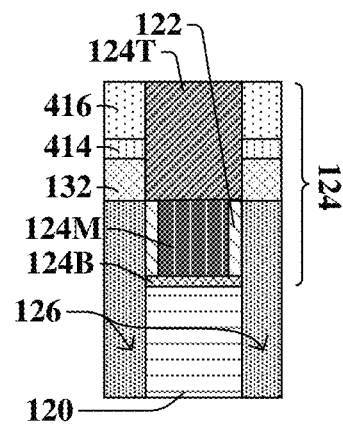

FIG. 5B illustrates a cross-sectional view 500B of some alternative embodiments of the contact via of FIG. 5A.

In some embodiments, the contact via 124 comprises multiple layers of materials. For example, in some embodiments, the bottom portion 124B of the contact via 124 comprises a first material; middle portion 124M of the contact via 124 comprises a second material; and the top portion 124T of the contact via 124 comprises a third material. In some embodiments, the first, second, and/or third materials may be different. For example, in some embodiments, the first, second, and third materials are different from one another, whereas in other embodiments, the first material and the second material may be the same and the third material is different than the first and second materials. Each of the top, middle, and bottom portions 124T, 124M, 124B of the contact via 124 may be different to accommodate for different etch selectivity requirements compared to surrounding features (e.g., spacer structure 126, first hard mask structure 132, etc.) during manufacturing.

In some embodiments, the first material of the bottom portion 124B of the contact via 124 may comprise, for example, tungsten, ruthenium, cobalt, copper, and/or some other conductive material. In some embodiments, the second material of the middle portion 124M of the contact via 124 may comprise, for example, tungsten, ruthenium, cobalt, copper, and/or some other conductive material. In some embodiments, the third material of the top portion 124T of the contact via 124 may comprise tungsten, ruthenium, cobalt, copper, titanium, titanium nitride, tantalum, tantalum nitride, molybdenum, nickel, and/or some other conductive material.

Figure 6A:
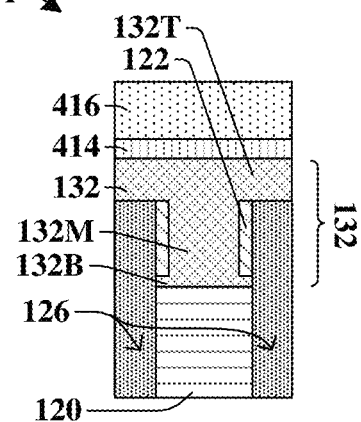
FIGS. 6A and 6B illustrate cross-sectional view of some embodiments comprising a hard mask structure arranged over a gate electrode, wherein the hard mask structure comprises one or more materials.

FIG. 6A illustrates a cross-sectional view 600A of some embodiments of a first hard mask structure arranged over a gate electrode.

In some embodiments, the first hard mask structure 132 comprises a top portion 132T arranged above the spacer structure 126, a middle portion 132M arranged directly between the liner layer 122 and the spacer structure 126, and a bottom portion 132B arranged directly over the gate electrode 120 and having outermost sidewalls directly contacting the spacer structure 126. In such embodiments, the middle portion 132M of the first hard mask structure 132 may have the smallest width compared to the top portion 132T and the bottom portion 132B of the first hard mask structure. The middle portion 132M is arranged between the top portion 132T and the bottom portion 132B. In some embodiments, the top portion 132T, the middle portion 132M, and the bottom portion 132B of the first hard mask structure 132 comprises a same material. In some embodiments, the first hard mask structure 132 comprises silicon oxide, hafnium silicon, silicon oxygen carbide, aluminum oxide, zirconium oxide, hafnium oxide, titanium oxide, zirconium aluminum oxide, zinc oxide, tantalum oxide, lanthanum oxide, yttrium oxide, tantalum carbon nitride, silicon nitride, silicon oxide carbon nitride, silicon, zirconium nitride, or silicon carbon nitride. In some embodiments, the first hard mask structure 132 comprises a low-k dielectric material, such as, for example, silicon nitride, silicon dioxide, silicon oxynitride, or the like.

Figure 6B:
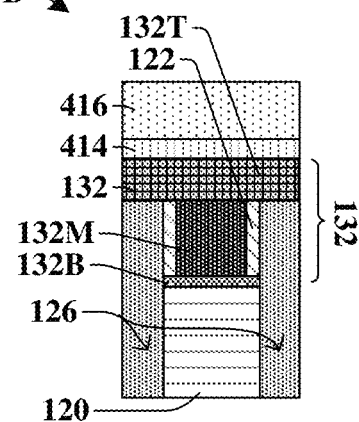

FIG. 6B illustrates a cross-sectional view 600B of some alternative embodiments of the first hard mask structure of FIG. 6A.

In some embodiments, the first hard mask structure 132 comprises multiple layers of materials. For example, in some embodiments, the bottom portion 132B of the first hard mask structure 132 comprises a fourth material; middle portion 132M of the first hard mask structure 132 comprises a fifth material; and the top portion 132T of the first hard mask structure 132 comprises a sixth material. In some embodiments, the fourth, fifth, and/or sixth materials may be different. For example, in some embodiments, the fourth, fifth, and sixth materials are different from one another, whereas in other embodiments, the fourth material and the fifth material may be the same and the sixth material is different than the fourth and fifth materials. Each of the top, middle, and bottom portions 132T, 132M, 132B of the first hard mask structure 132 may be different to accommodate for different etch selectivity requirements compared to surrounding features (e.g., spacer structure 126, contact via 124, etc.) during manufacturing.

In some embodiments, the first material of the bottom portion 132B of the first hard mask structure 132 may comprise, for example, silicon oxide, hafnium silicon, silicon oxygen carbide, aluminum oxide, zirconium silicon, aluminum oxygen nitride, zirconium oxide, hafnium oxide, titanium oxide, zirconium aluminum oxide, zinc oxide, tantalum oxide, lanthanum oxide, yttrium oxide, tantalum carbon nitride, silicon nitride, silicon oxygen carbon nitride, silicon zirconium nitride, silicon carbon nitride, or the like. In some embodiments, the second material of the middle portion 132M of the first hard mask structure 132 may comprise, for example, silicon oxide, hafnium silicon, silicon oxygen carbide, aluminum oxide, zirconium silicon, aluminum oxygen nitride, zirconium oxide, hafnium oxide, titanium oxide, zirconium aluminum oxide, zinc oxide, tantalum oxide, lanthanum oxide, yttrium oxide, tantalum carbon nitride, silicon nitride, silicon oxygen carbon nitride, silicon zirconium nitride, silicon carbon nitride, or the like. In some embodiments, the third material of the top portion 132T of the first hard mask structure 132 may comprise, for example, silicon oxide, hafnium silicon, silicon oxygen carbide, aluminum oxide, zirconium oxide, hafnium oxide, titanium oxide, zirconium aluminum oxide, zinc oxide, tantalum oxide, lanthanum oxide, yttrium oxide, tantalum carbon nitride, silicon nitride, silicon oxide carbon nitride, silicon, zirconium nitride, silicon carbon nitride, or the like.

FIGS. 7A-7D illustrate cross-sectional views 700A-700D of various embodiments of an integrated chip comprising a liner layer over a gate electrode, wherein a first width of the gate electrode and a second width of the contact via are substantially equal.

In the cross-sectional view 700A of FIG. 7A, the contact via 124 did not "land centered" over the gate electrode 120 although the second width $w_2$ is substantially equal to the first width $w_1$. Further, the first height $h_1$ of the first hard mask structure 132 measured from the topmost surface 120t of the gate electrode 120 is about equal to the second height $h_2$ of the liner layer 122 measured from the topmost surface 120t of the gate electrode 120. Thus, the liner layer 122 covers first and second topmost surfaces 126a, 126b of the spacer structure 126. Thus, although the contact via 124 is arranged directly over the first topmost surface 126a of the spacer structure 126, in some embodiments, the liner layer 122 prevents the spacer structure 126 from being exposed to the first etchant used to remove portions of the first hard mask structure 132 to form the contact via 124. Although the liner layer 122 does not contact the gate electrode 120, the topmost surface 120t of the gate electrode 120 may not be fully covered by the contact via 124 at least because the contact via 124 did not "land centered" over the gate electrode 120, in some embodiments. In some embodiments, a portion 702 of the liner layer 122 that is directly between the contact via 124 and the spacer structure 126 may have an increased surface roughness due to damage from the first etchant used to remove portions of the first hard mask structure 132. Although the liner layer 122 may have a slow removal rate when exposed to the first etchant, portions of the liner layer 122 may be removed or damaged. Nevertheless, in some embodiments, the liner layer 122 sufficiently protects the spacer structure 126 from removal by the first etchant.

As illustrated in the cross-sectional view 700B of FIG. 7B, in some embodiments, the contact via 124 may be substantially centered over gate electrode 120, and the first height $h_1$ of the of the first hard mask structure 132 may be greater than the second height $h_2$ of the liner layer 122. In such embodiments, the liner layer 122 still may be arranged over and may completely cover the first topmost surface 126a and the second topmost surface 126b of the spacer structure 126. In such embodiments, the liner layer 122 may protect the spacer structure 126 from exposure from and removal by the first etchant used to remove portions of the first hard mask structure 132 during formation of the contact via 124.

As illustrated in the cross-sectional view 700C of FIG. 7C, in some embodiments, the contact via 124 may be substantially centered over gate electrode 120, and the first height $h_1$ of the first hard mask structure 132 may be greater than the second height $h_2$ of the liner layer 122. In such embodiments, the liner layer 122 may not be arranged over the first and second topmost surfaces 126a, 126b of the spacer structure 126. However, because the contact via 124 is substantially centered over the gate electrode and the first width $w_1$ is about equal to the second width $w_2$, the spacer structure 126 may be protected from the first etchant. Thus, the spacer structure 126 may have a substantially uniform thickness throughout its height.

As illustrated in the cross-sectional view 700D of FIG. 7D, in some embodiments, the contact via 124 is not substantially centered over the gate electrode 120, and the first height $h_1$ of the first hard mask structure 132 is greater than the second height $h_2$ of the liner layer 122. Further, the liner layer 122 may not be arranged over the first and second topmost surfaces 126a, 126b of the spacer structure 126. Thus, the spacer structure 126 may not be fully protected by the liner layer 122. In such embodiments, portions of the spacer structure 126 and the liner layer 122 may be removed during the formation of the contact via 124. The spacer structure 126 and/or the liner layer 122 may have a varying thickness throughout its height. For example, the first topmost surface 126a of the spacer structure may have a first thickness $t_1$, the spacer structure 126 may have a second thickness $t_2$ that is greater than the first thickness $t_1$ at a first location below the first topmost surface 126a of the spacer structure 126, and the spacer structure 126 may have a third thickness $t_3$ that is greater than the second thickness $t_2$.

FIGS. 8A-8D illustrate cross-sectional views 800A-800D of various embodiments of an integrated chip comprising a liner layer over a gate electrode, wherein a first width of the gate electrode and a second width of the contact via are substantially equal, and wherein portions of the liner layer are removed from the spacer structure.

In FIGS. 8A-8D, after removing the first hard mask structure 132 and before depositing the contact via 124, remaining exposed portions of the liner layer 122 may be removed from the gate electrode 120. Advantages of removing exposed portions of the liner layer 122 include an easier deposition of the material of the contact via 124 because the material of the contact via 124 does not have to flow directly between the liner layer 122 and the gate electrode 120, and/or a reduced capacitance in the final device. However, removing exposed portions of the liner layer 122 may increase the manufacturing time and/or damage the spacer structure 126. Thus, FIGS. 8A, 8B, 8C, and 8D may comprise similar features as FIGS. 7A, 7B, 7C, and 7D, respectively, except that in FIGS. 8A, 8B, 8C, and 8D, portions of the liner layer 122 have been removed.

Figure 8A:
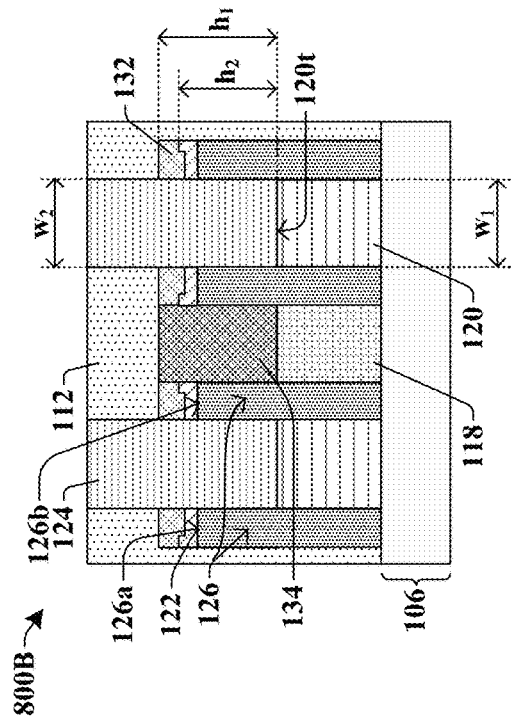
Figure 8B:
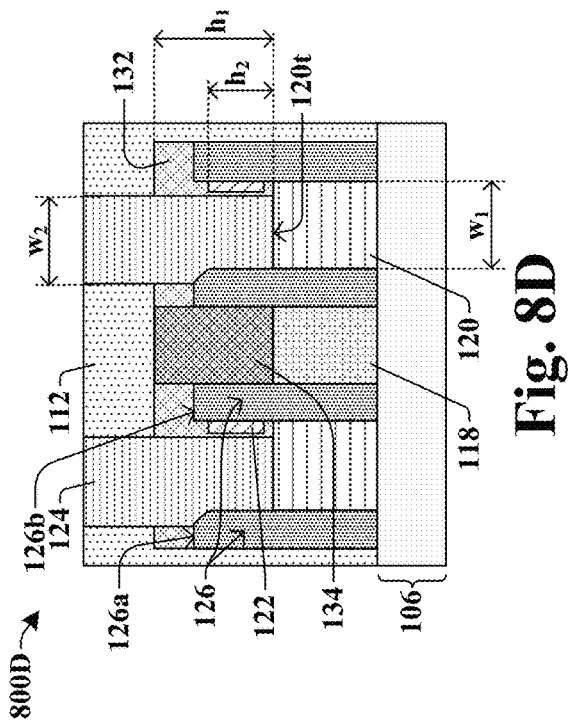
Figure 8C:
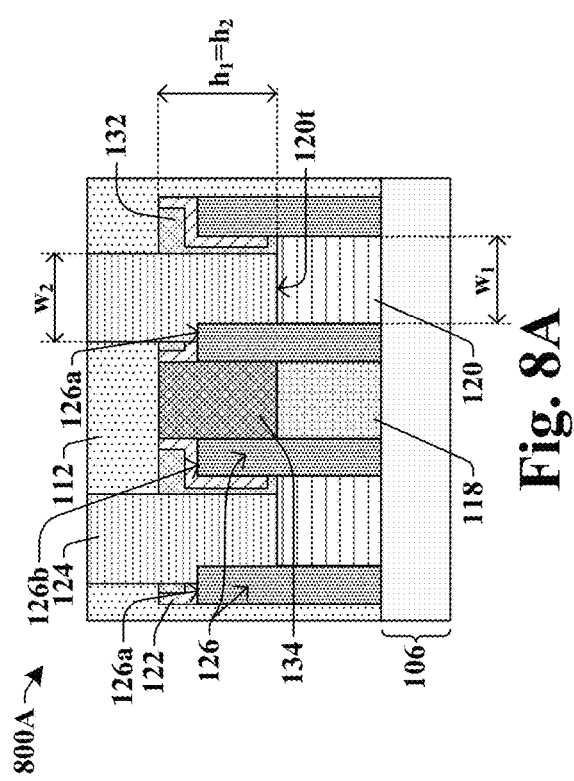

Further, as illustrated in the cross-sectional view 800C of FIG. 8C, in some embodiments, the first height $h_1$ of the of the first hard mask structure 132 is greater than the second height $h_2$ of the liner layer (122 of FIG. 8B). In such embodiments, the liner layer (122 of FIG. 8B) may be arranged beneath the first topmost surface 126a and the second topmost surface 126b of the spacer structure 126, and thus, the liner layer (122 of FIG. 8B) does not cover the first and second topmost surfaces 126a, 126b of the spacer structure 126. In such embodiments, from the cross-sectional view 800C, the liner layer (122 of FIG. 8B) may not be visible. However, it will be appreciated that the liner layer (122 of FIG. 8B) would be visible from other cross-sectional view perspectives.

Figure 8D:
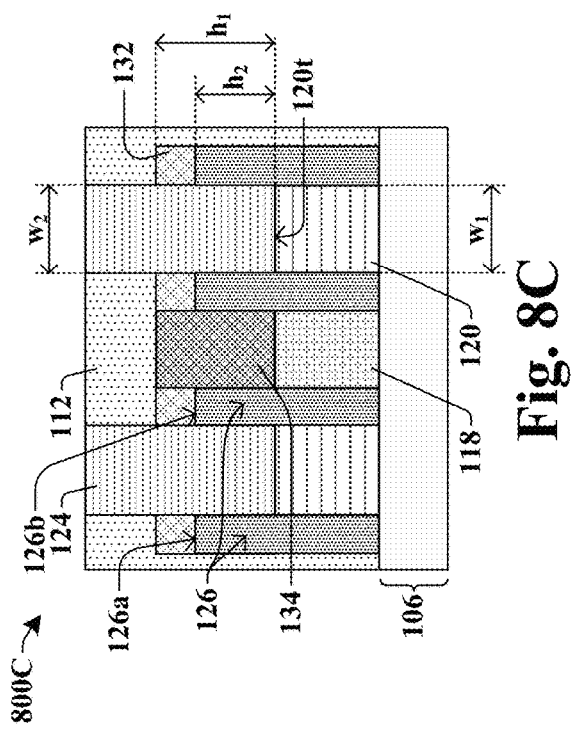

As illustrated in the cross-sectional view 800D of FIG. 8D, the liner layer 122 that is surrounded by the first hard mask structure 132 may be visible because the contact via 124 is not substantially centered over the gate electrode 120.

FIGS. 9A-9D illustrate cross-sectional views 900A-900D of various embodiments of an integrated chip comprising a liner layer over a contact layer, wherein the gate electrode is wider than an overlying contact via.

In FIGS. 9A-9D, the contact via 124 is substantially centered over the gate electrode 120 (e.g., the contact via 124 does not directly overlie the spacer structure 126), and the first width $w_1$ of the gate electrode 120 is greater than the second width $w_2$ of the contact via 124. In some embodiments, if the contact via 124 does not directly overlie the spacer structure 126, the spacer structure 126 may have a substantially uniform thickness throughout its height. For example, in some embodiments, as illustrated in the cross-sectional view 900A of FIG. 9A, the first topmost surface 126a of the spacer structure 126 may have a first thickness $t_1$ that is substantially equal to the second and third thicknesses $t_2$, $t_3$ of the spacer structure 126, wherein the third thickness $t_3$ is a maximum thickness of the spacer structure 126.

Figure 9A:
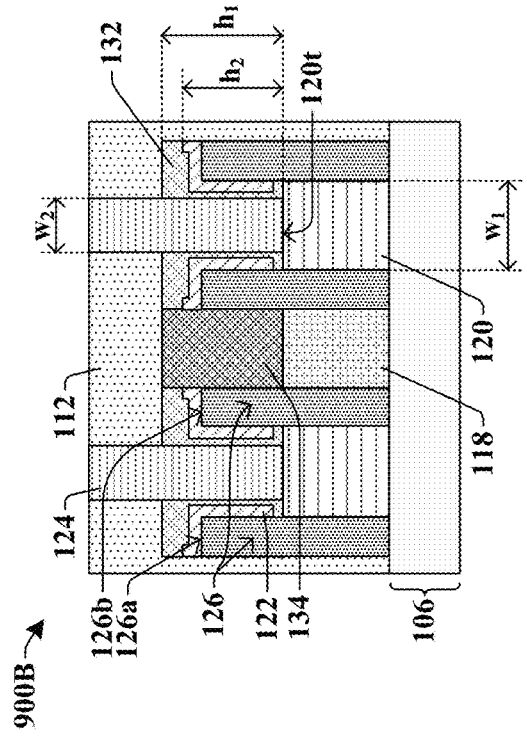

As illustrated in the cross-sectional view 900A of FIG. 9A, in some embodiments, the first height $h_1$ of the of the first hard mask structure 132 is about equal to the second height $h_2$ of the liner layer 122. In such embodiments, the liner layer 122 may completely cover the first topmost surface 126a and the second topmost surface 126b of the spacer structure 126.

Figure 9B:
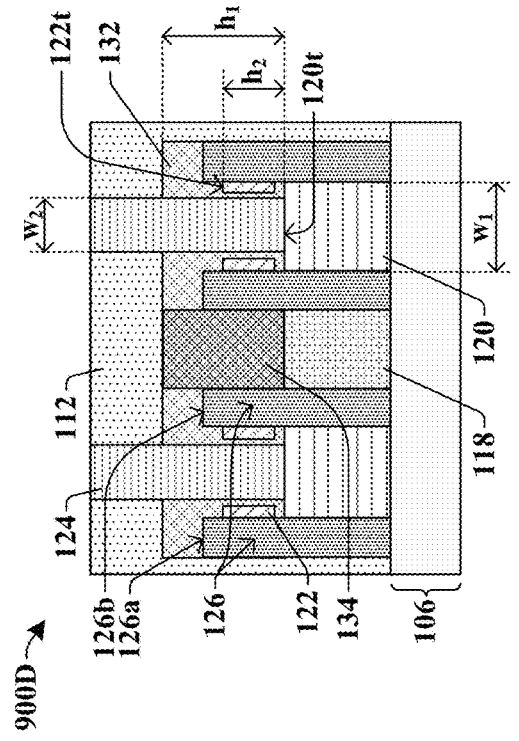

As illustrated in the cross-sectional view 900B of FIG. 9B, in some embodiments, the first height $h_1$ of the of the first hard mask structure 132 is greater than the second height $h_2$ of the liner layer 122. In such embodiments, the liner layer 122 still may be arranged over and may completely cover the first topmost surface 126a and the second topmost surface 126b of the spacer structure 126.

Figure 9C:
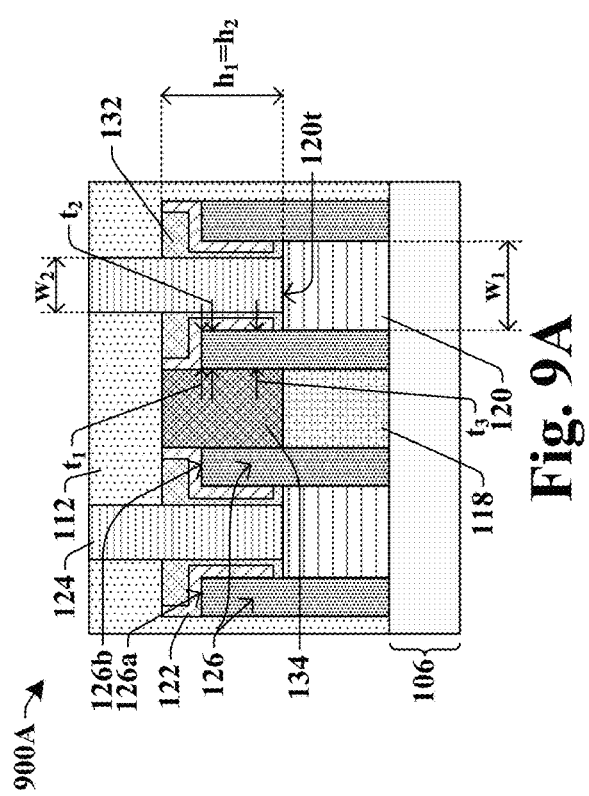

As illustrated in the cross-sectional view 900C of FIG. 9C, in some embodiments, the first height $h_1$ of the of the first hard mask structure 132 is greater than the second height $h_2$ of the liner layer 122. In such embodiments, the liner layer 122 may have a topmost surface 122t that is at about a same height as the first and second topmost surfaces 126a, 126b of the spacer structure 126. For example, the topmost surface 122t of the liner layer 122 may be at a second height $h_2$ measured from a topmost surface 120t of the gate electrode 120 in a vertical direction, and the first and second topmost surfaces 126a, 126b of the spacer structure may also be at the second height $h_2$ measured from a topmost surface 120t of the gate electrode 120. Because the contact via 124 does not overlie the spacer structure 126, in some embodiments, the spacer structure 126 has a substantially uniform thickness throughout its height.

Figure 9D:
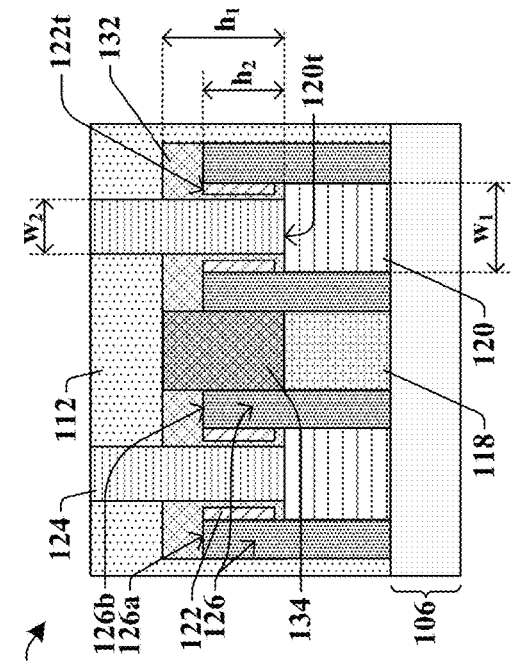
Figure 10A:
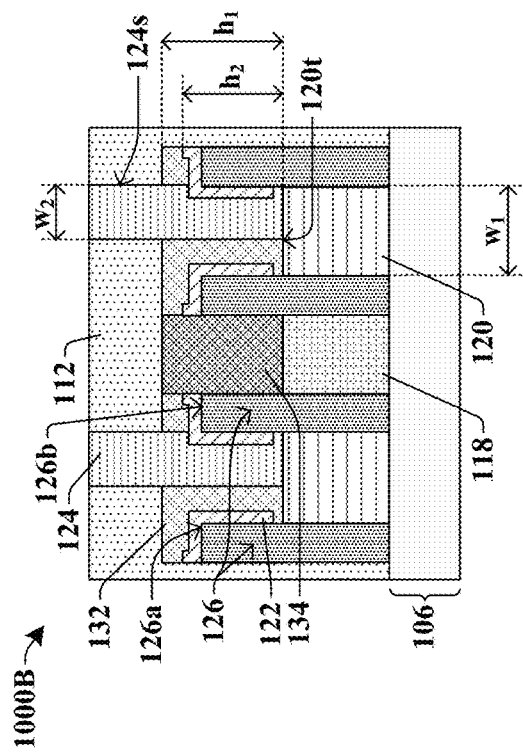
Figure 10B:
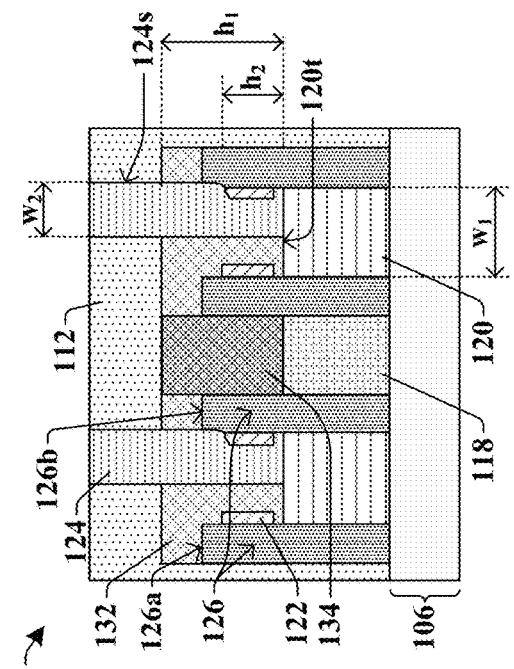
Figure 10C:
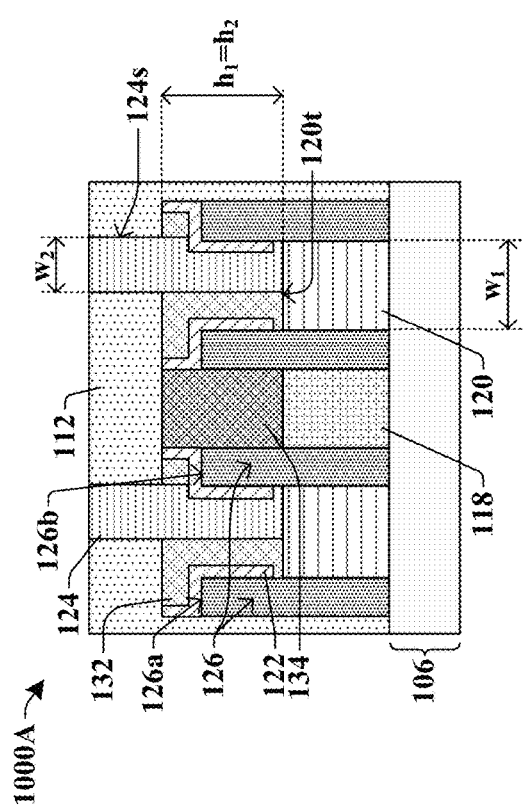
Figure 10D:
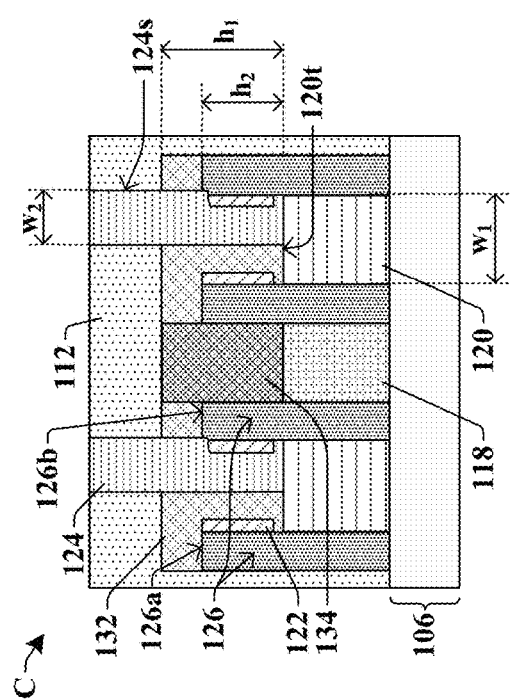
Figure 11A:
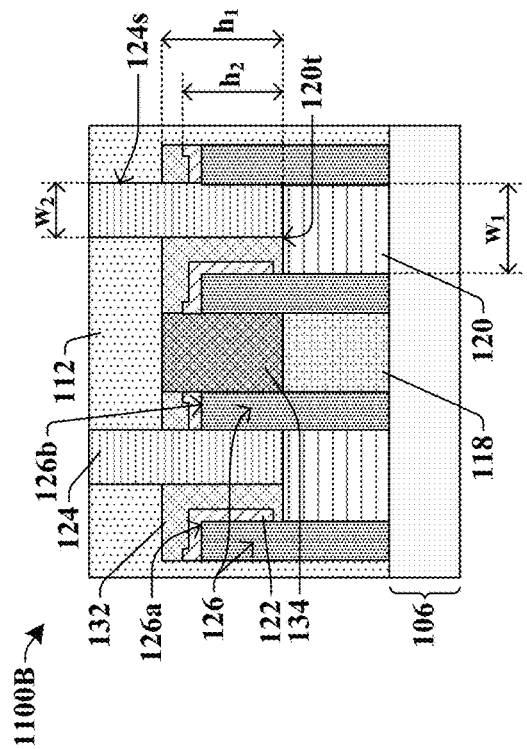
Figure 11B:
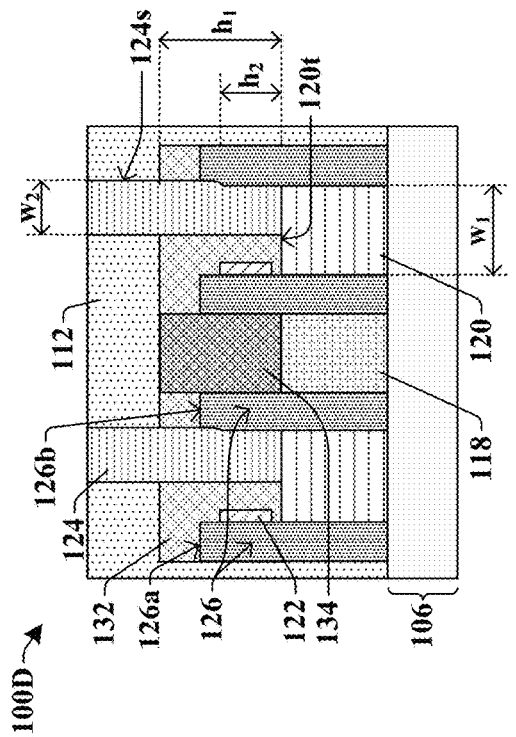
Figure 11C:
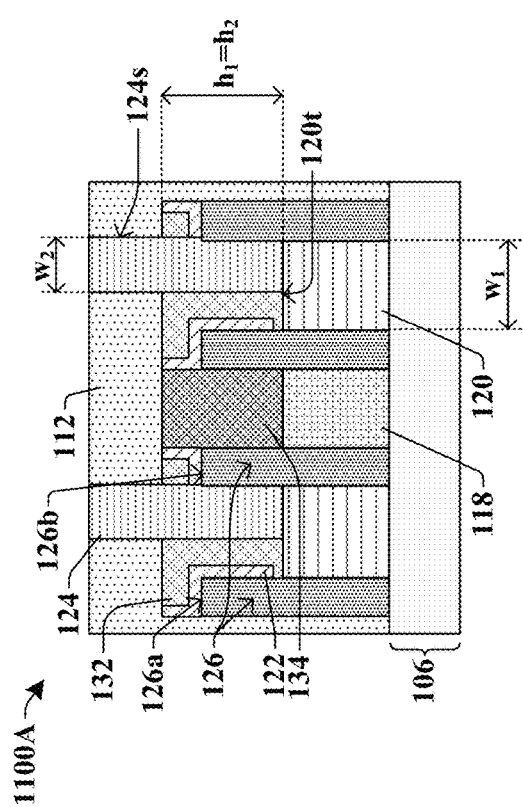
Figure 11D:
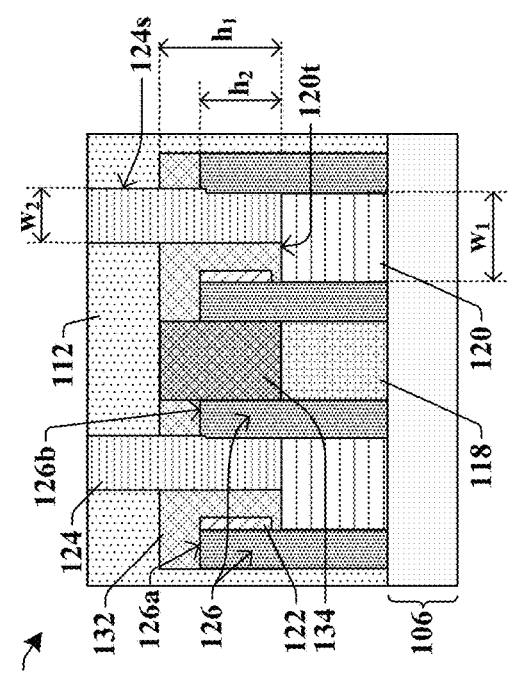

As illustrated in the cross-sectional view 900D of FIG. 9D, in some embodiments, the first height $h_1$ of the of the first hard mask structure 132 is greater than the second height $h_2$ of the liner layer 122. In such embodiments, the topmost surface 122t of the liner layer 122 may be arranged beneath the first topmost surface 126a and the second topmost surface 126b of the spacer structure 126.

FIGS. 10A-10D illustrate cross-sectional views 1000A-1000D of some other various embodiments of an integrated chip comprising a liner layer over a gate electrode, wherein the gate electrode is wider than an overlying contact via.

In FIGS. 10A-10D, the first width $w_1$ of the gate electrode 120 is greater than the second width $w_2$ of the contact via 124. In some embodiments, the contact via 124 may not "land centered" over the gate electrode 120 during manufacturing. For example, the outermost sidewall 124s of the contact via 124 may directly overlie the spacer structure 126. In some embodiments where the contact via 124 does not "land centered" over the gate electrode 120, portions of the liner layer 122 may be arranged directly between the contact via 124 and the gate electrode 120. The liner layer 122 may mitigate or prevent removal of the spacer structure 126 during the formation of the contact layer 118.

As illustrated in the cross-sectional views 1000A and 1000B, because the liner layer 122 covers first and second topmost surfaces 126a, 126b of the spacer structure 126, loss of the spacer structure 126 during formation of the contact via 124 is prevented, in some embodiments. In such embodiments, the spacer structure 126 may have a substantially uniform thickness throughout its height.

As illustrated in the cross-sectional views 1000C and 1000D, because the liner layer 122 does not cover first and second topmost surfaces 126a, 126b of the spacer structure 126, loss of the spacer structure 126 during formation of the contact via 124 may be mitigated but not prevented, in some embodiments. In such embodiments, the spacer structure 126 may have a varying thickness throughout its height.

FIGS. 11A-11D illustrate cross-sectional views 1100A-1100D of some other various embodiments of an integrated chip comprising a liner layer over a gate electrode, wherein the gate electrode is wider than an overlying contact via, and wherein portions of the liner layer are removed from the spacer structure.

In FIGS. 11A-11D, after removing the first hard mask structure 132 and before depositing the contact via 124, remaining exposed portions of the liner layer 122 may be removed from the gate electrode 120. Advantages of removing exposed portions of the liner layer 122 include an easier deposition of the material of the contact via 124 because the material of the contact via 124 does not have to flow directly between the liner layer 122 and the gate electrode 120. Other advantages include a reduced capacitance of the final device. However, removing exposed portions of the liner layer 122 may increase the manufacturing time and/or damage the spacer structure 126. In some embodiments, FIGS. 11A, 11B, 11C, and 11D may comprise similar features as FIGS. 10A, 10B, 10C, and 10D, respectively, except that in FIGS. 11A, 11B, 11C, and 11D, portions of the liner layer 122 that would be arranged directly between the contact via 124 and the gate electrode 120 have been removed.

FIGS. 12A-12C illustrate cross-sectional views 1200A-1200C of various embodiments of an integrated chip comprising a liner layer over a gate electrode, wherein the gate electrode is more narrow than an overlying contact via.

As illustrated in the cross-sectional views 1200A and 1200B of FIGS. 12A and 12B, respectively, although the contact via 124 is substantially centered over the gate electrode 120, the contact via 124 still directly overlies the spacer structure 126. In some embodiments, the liner layer 122 completely covers the first and second topmost surfaces 126a, 126b of the spacer structure 126. Thus, the liner layer 122 may prevent the spacer structure 126 from being exposed to the first etchant used to remove the first hard mask structure 132 during formation of the contact via 124. In such embodiments, loss of the spacer structure 126 may be prevented and thus, has a substantially uniform thickness throughout its height.

As illustrated in the cross-sectional view 1200C of FIG. 12C, although the contact via 124 is substantially centered over the gate electrode 120, the contact via 124 still directly overlies the spacer structure 126. In some embodiments, the liner layer 122 does not completely cover the first and second topmost surfaces 126a, 126b of the spacer structure 126. Thus, the spacer structure 126 may be exposed to the first etchant used to remove the first hard mask structure 132 during formation of the contact via 124. In such embodiments, loss of the spacer structure 126 may be mitigated, but not prevented, by the liner layer 122, and the spacer structure 126 may have a varying thickness throughout its height.

Figure 13A:
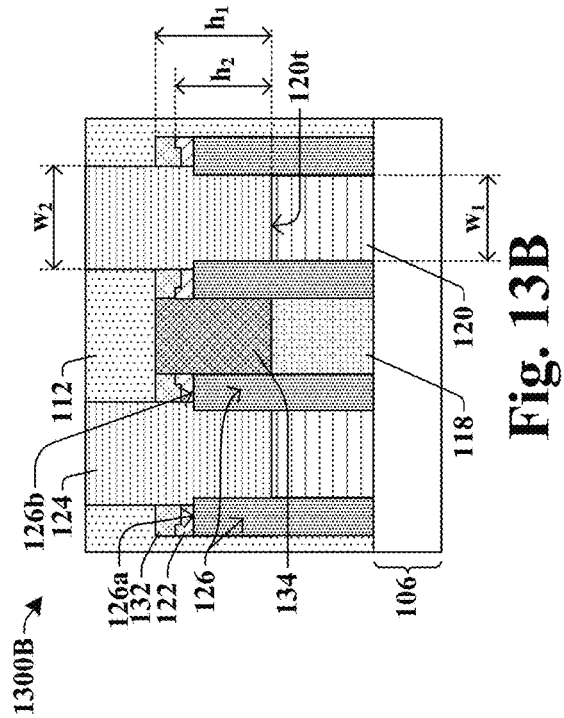
Figure 13B:
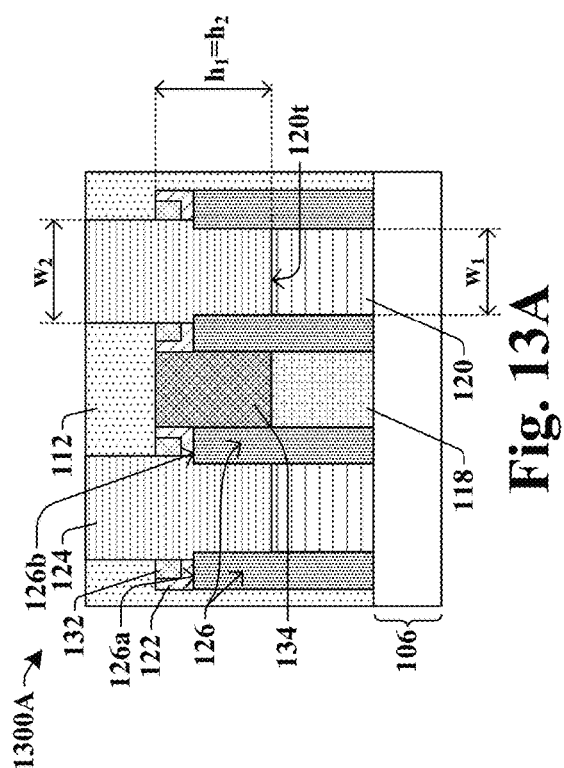
Figure 13C:
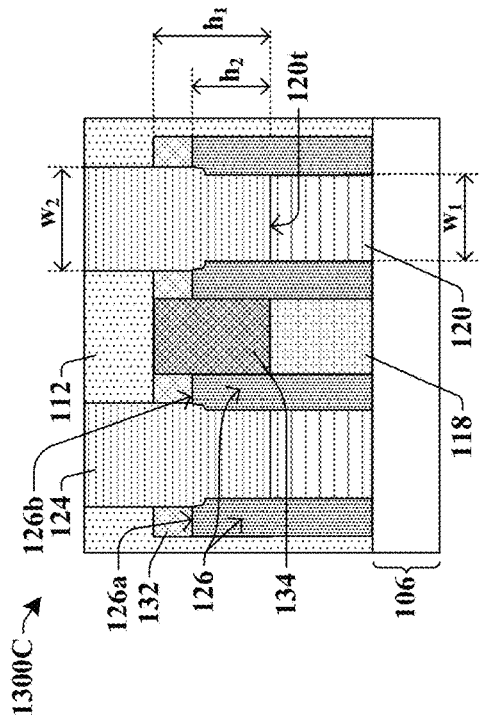

FIGS. 13A-13C illustrate cross-sectional views 1300A-1300C of some other various embodiments of an integrated chip comprising a liner layer over a gate electrode, wherein the gate electrode is more narrow than an overlying contact via, and wherein portions of the liner layer are removed from the spacer structure.

In FIGS. 13A-13C, after removing the first hard mask structure 132 and before depositing the contact via 124, remaining exposed portions of the liner layer 122 may be removed from the gate electrode 120. Advantages of removing exposed portions of the liner layer 122 include an easier deposition of the material of the contact via 124 because the material of the contact via 124 does not have to flow directly between the liner layer 122 and the gate electrode 120. Other advantages include a reduced capacitance of the final device. However, removing exposed portions of the liner layer 122 may increase the manufacturing time and/or damage the spacer structure 126. In some embodiments, FIGS. 13A, 13B, and 13C may comprise similar features as FIGS. 12A, 12B, and 12C, respectively, except that in FIGS. 13A, 13B, and 13C, portions of the liner layer 122 that would be arranged directly between the contact via 124 and the gate electrode 120 have been removed.

FIGS. 14A-14C illustrate cross-sectional views 1400A-1400C of various embodiments of an integrated chip comprising a contact via and liner layer over a first gate electrode and a second gate electrode.

In FIGS. 14A-14C, a contact via 124 continuously extends over a first gate electrode 120a and a second gate electrode 120b, in some embodiments. In such embodiments, outermost sidewalls 124s of the contact via 124 may directly overlie the spacer structure. Thus, FIGS. 14A-14C may comprise same or similar features as FIGS. 12A-12C, respectively, in some embodiments, except that in FIGS. 14A-14C, a contact via 124 continuously extends from the first gate electrode 120a, over the contact layer 118, and to the second gate electrode 120b. In some embodiments, the second hard mask structure 134 separates the contact layer 118 from the contact via 124.

FIGS. 15A-15C illustrate cross-sectional views 1500A-1500C of various embodiments of an integrated chip comprising a contact via and liner layer over a first gate electrode and a second gate electrode.

Like FIGS. 14A-14C, in FIGS. 15A-15C, a contact via 124 continuously extends over a first gate electrode 120a and a second gate electrode 120b, in some embodiments. In such embodiments, outermost sidewalls 124s of the contact via 124 may directly overlie the spacer structure 126.

Further, in FIGS. 15A-15C, after removing the first hard mask structure 132 and before depositing the contact via 124, remaining exposed portions of the liner layer 122 may be removed from the first and second gate electrodes 120a, 120b. Thus, after the contact via 124 is deposited/formed, the liner layer 122 is not arranged between the contact via 124 and the first or second gate electrodes 120a, 120b. Thus, FIGS. 15A-15C may comprise same or similar features as FIGS. 14A-14C, respectively, in some embodiments, except that in FIGS. 15A-15C, a contact via 124 continuously extends from the first gate electrode 120a, over the contact layer 118, and to the second gate electrode 120b. In some embodiments, the second hard mask structure 134 separates the contact layer 118 from the contact via 124.

FIGS. 16-37 illustrate various views 1600-3700 of some embodiments of a method of forming a liner layer over a spacer structure surrounding a gate electrode in order to reduce losses of the spacer structure during removal processes. Although FIGS. 16-37 are described in relation to a method, it will be appreciated that the structures disclosed in FIGS. 16-37 are not limited to such a method, but instead may stand alone as structures independent of the method.

Figure 16:
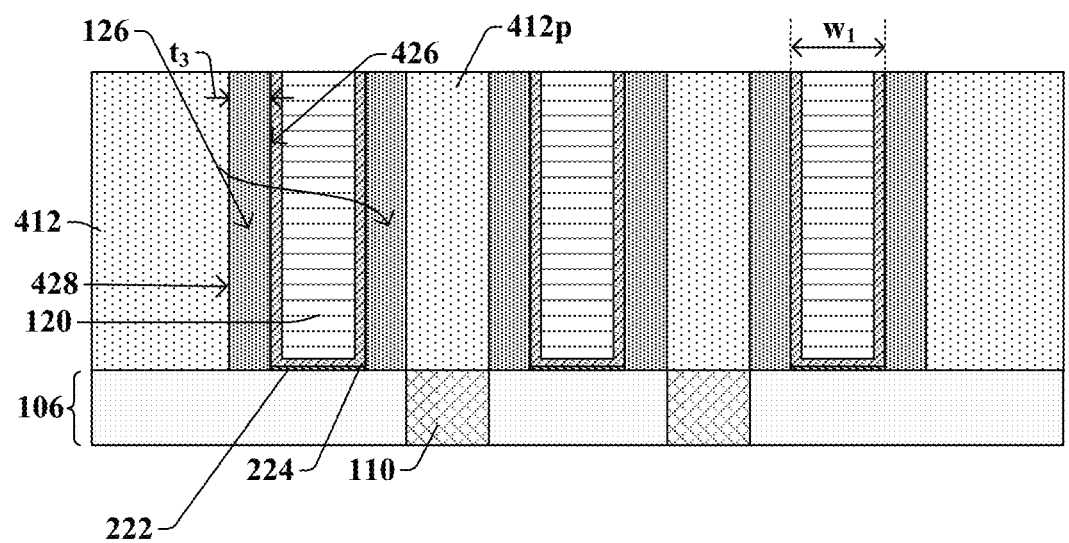
FIGS. 16-37 illustrate cross-sectional views of some embodiments of a method of forming an integrated chip comprising a liner layer arranged over a spacer structure and a gate electrode to protect the spacer structure from removal processes.

As shown in cross-sectional view 1600 of FIG. 16, a substrate 106 comprising a source/drain region 110 may be provided. The substrate 106 may comprise a semiconductor material, such as silicon or germanium, for example. In some embodiments, the source/drain region 110 is formed by removing portions of the substrate 106, and epitaxially growing the source/drain region 110 on the substrate 106. In other embodiments, the source/drain region 110 may be formed by selectively doping the substrate 106. The source/drain region 110 has a different doping type than the substrate 106. Further, a gate electrode 120 may be formed over the substrate 106 within a first dielectric layer 412. The gate electrode 120 may have lower and sidewall surfaces surrounded by a gate dielectric layer 224. In some embodiments, the gate dielectric layer 224 may comprise a high-k dielectric material such as, for example, hafnium oxide, zirconium oxide, or the like. Further, in some embodiments, an interfacial layer 222 may be arranged directly between the substrate 106 and the gate electrode 120. In some embodiments, the interfacial layer 222 may comprise silicon dioxide, for example. The gate electrode 120 may comprise a conductive material such as, for example, polysilicon, aluminum, ruthenium, palladium, or some other conductive metal.

The gate electrode 120 may be surrounded by a spacer structure 126. In some embodiments, the spacer structure 126 separates the gate dielectric layer 224 from the first dielectric layer 412. In some embodiments, a portion 412p of the first dielectric layer 412 may directly overlie the source/drain region 110. In some embodiments, the first dielectric layer 412 comprises, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. Further, in some embodiments, the spacer structure 126 comprises, for example, a low-k dielectric material, such as, silicon oxygen carbide, zirconium silicon, tantalum carbon nitride, silicon nitride, silicon oxygen carbon nitride, silicon, zirconium nitride, or silicon carbon nitride. The spacer structure 126 may have a third thickness $t_3$ measured from a first inner sidewall 426 to a first outer sidewall 428 in a lateral direction. In some embodiments, the third thickness $t_3$ is in a range of between, for example, approximately 1 nanometer and approximately 40 nanometers.

In some embodiments, the gate electrode 120 and the gate dielectric layer 224 may have a first width $w_1$ measured in the lateral direction between outermost sidewalls of the gate dielectric layer 224. In other embodiments, the first width $w_1$ may be measured in the lateral direction between outermost sidewalls of the gate electrode 120. In some embodiments, the first width $w_1$ is in a range of between, for example, approximately 1 nanometer and approximately 30 nanometers.

Figure 17:
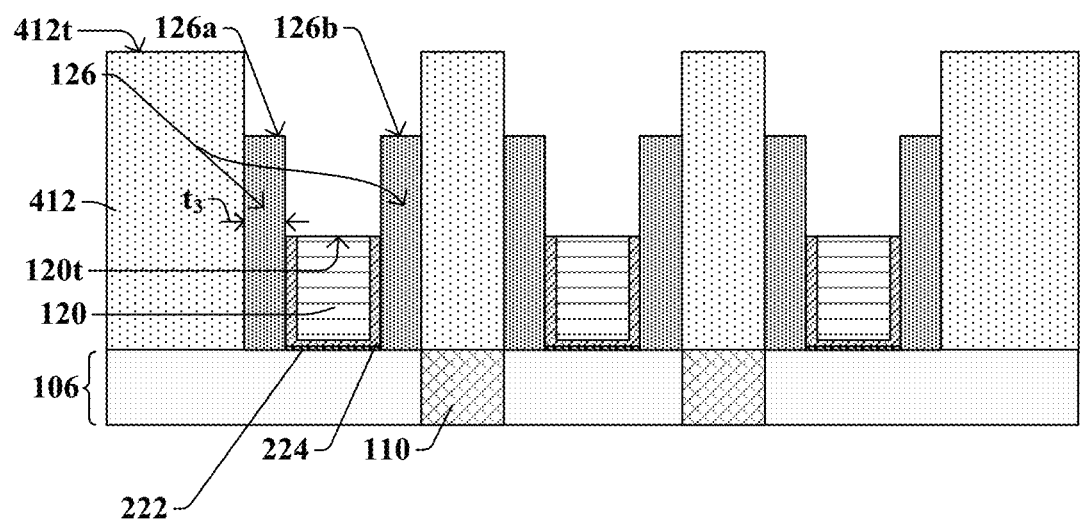

As shown in cross-sectional view 1700 of FIG. 17, in some embodiments, a gate electrode etchback process may be performed to reduce the height of the gate electrode 120, such that a topmost surface 120t of the gate electrode 120 is arranged below a topmost surface 412t of the first dielectric layer 412. In some embodiments, the gate electrode etchback process may be conducted by way of photolithography and removal (e.g., etching) processes, for example. The gate electrode etchback process may also reduce the height of the gate dielectric layer 224 in some embodiments, whereas in other embodiments, the gate dielectric layer 224 may have a height at a same level with the spacer structure 126 after the gate electrode etchback.

In some embodiments, the spacer structure 126 is also reduced in height such that first and second topmost surfaces 126a, 126b of the spacer structure 126 are arranged below the topmost surface 412t of the first dielectric layer 412. In some embodiments, the spacer structure 126 is reduced in height using the same process as the gate electrode etchback. In other embodiments, a spacer etchback process separate from the gate electrode etchback is used to reduce the height of the spacer structure 126. The first and second topmost surfaces 126a, 126b are arranged between the topmost surface 120t of the gate electrode 120 and the topmost surface 412t of the first dielectric layer 412. Further, in some embodiments, the gate dielectric layer 224 is removed by the spacer etchback process; in other embodiments, the gate dielectric layer 224 is removed by the gate etchback process; or the gate dielectric layer 224 is removed by a separate gate dielectric layer etchback process.

Figure 18:
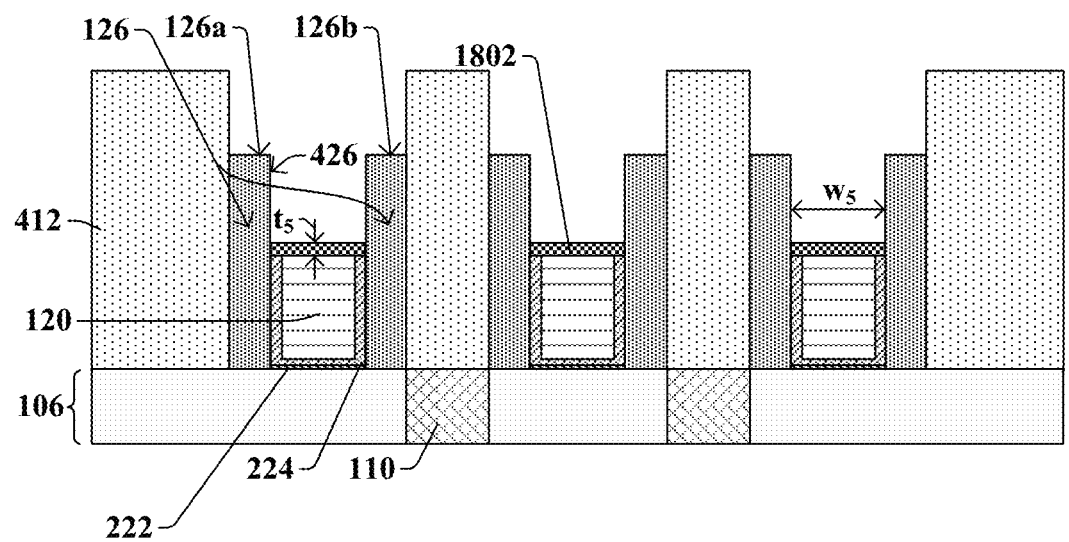

As shown in cross-sectional view 1800 of FIG. 18, in some embodiments, a sacrificial layer 1802 is formed over the gate electrode 120 and below the first and second topmost surfaces 126a, 126b of the spacer structure 126. The sacrificial layer 1802 may contact the first inner sidewall 426 of the spacer structure 126, but does not continuously cover portions of the first inner sidewall 426 of the spacer structure 126 that are above the gate electrode 120. In some embodiments, the sacrificial layer 1802 may also be arranged over the gate dielectric layer 224.

In some embodiments, the sacrificial layer 1802 comprises an organic material, a polymeric material and/or an amphiphilic compound, for example. In some embodiments, the sacrificial layer 1802 is selectively deposited over the gate electrode 120, whereas in other embodiments, the sacrificial layer 1802 may be deposited over the gate electrode 120, the spacer structure 126, and the first dielectric layer 412. Then, portions of the sacrificial layer 1802 arranged over the spacer structure 126 and the first dielectric layer 412 are removed. In some embodiments, the sacrificial layer 1802 may be deposited by way of a deposition process (e.g., chemical vapor deposition (CVD), physical vapor deposition (PVD), atomic layer deposition (ALD), etc.). Further, in some embodiments, the sacrificial layer 1802 may have a fifth thickness $t_5$ measured in the vertical direction. The fifth thickness $t_5$ may be in a range of between, for example, approximately 1 nanometer and approximately 50 nanometers. Further, the sacrificial layer 1802 may have a fifth width $w_5$ measured in the lateral direction. In some embodiments, the fifth width $w_5$ is in a range of between, for example, approximately 5 nanometers and approximately 30 nanometers.

Figure 19:
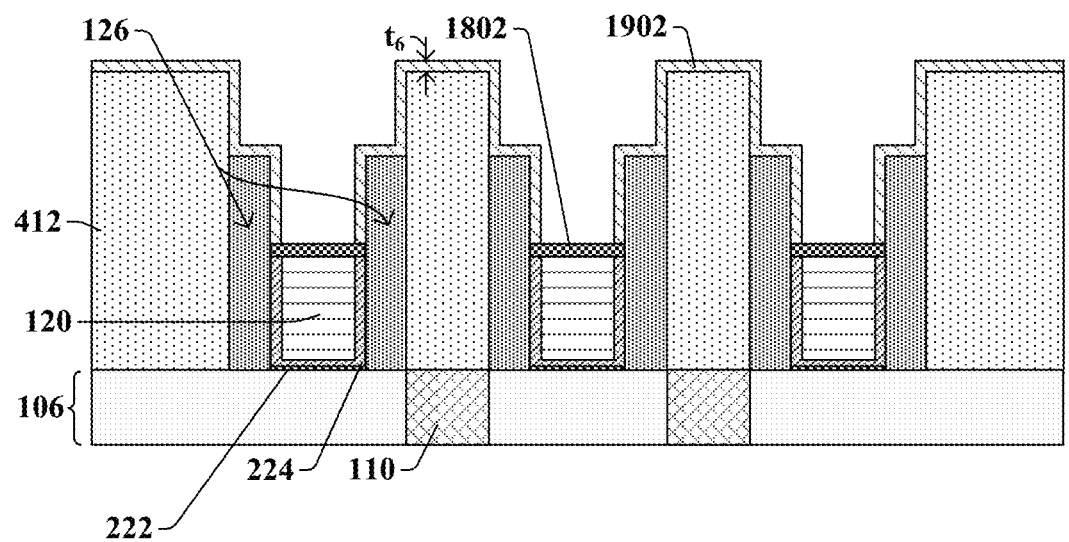

As shown in cross-sectional view 1900 of FIG. 19, a continuous liner layer 1902 may be formed over the first dielectric layer 412, the spacer structure 126, and the gate electrode 120. In some embodiments, the continuous liner layer 1902 may comprise, a high-k dielectric material, such as, for example, aluminum oxide, zirconium oxide, hafnuim oxide, titanium oxide, zirconium aluminum oxide, zinc oxide, tantalum oxide, lanthanum oxide, or yttrium oxide. The continuous liner layer 1902 comprises a different material than the spacer structure 126, and may comprise a material with a higher dielectric constant than the spacer structure 126. Further, in some embodiments, the continuous liner layer 1902 may have a sixth thickness $t_6$ in a range of between, for example, approximately 1 nanometer and approximately 10 nanometers. In some embodiments, the continuous liner layer 1902 is selectively deposited such that the continuous liner layer 1902 does not completely cover the sacrificial layer 1802. The continuous liner layer 1902 is spaced apart from the gate electrode 120 and/or the gate dielectric layer 224 because of the sacrificial layer 1802. In some embodiments, the continuous liner layer 1902 may be formed by way of a deposition process, such as, for example, atomic layer deposition (ALD). In other embodiments, the continuous liner layer 1902 may be formed by way of other deposition processes such as chemical vapor deposition (CVD) or physical vapor deposition (PVD), for example. In some embodiments, the continuous liner layer 1902 is selectively deposited on the first dielectric layer 412 and the spacer structure 126 because the material of the sacrificial layer 1802 (e.g., an organic material, a polymeric material, an amphiphilic compound, etc.) prevents the continuous liner layer 1902 from being deposited over the sacrificial layer 1802.

Figure 20:
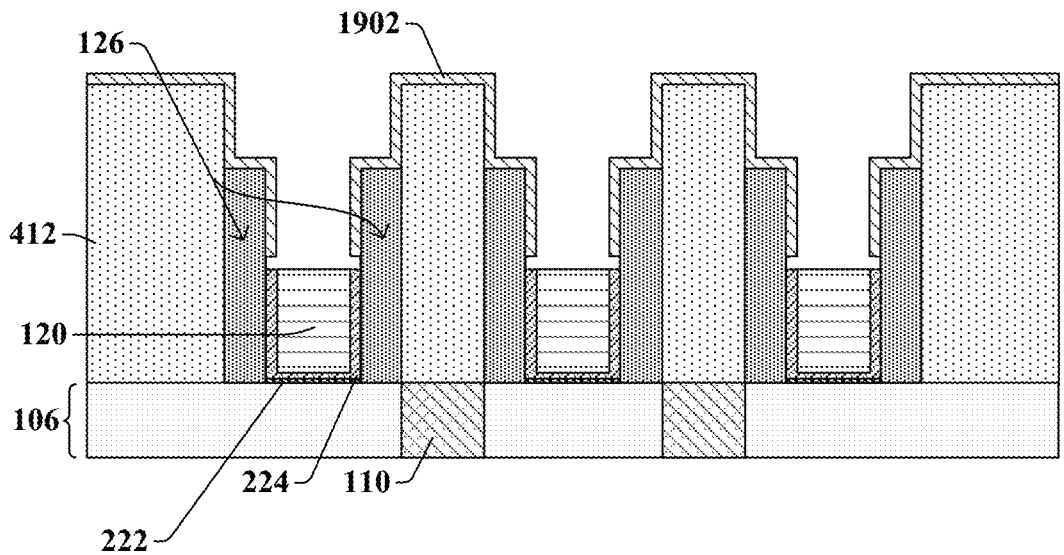

As shown in cross-sectional view 2000 of FIG. 20, a first removal process is conducted to remove the sacrificial layer (1802 of FIG. 19). In some embodiments, the first removal process completely removes the sacrificial layer (1802 of FIG. 19). Further, after the removal process, the spacer structure 126 and the continuous liner layer 1902 may remain substantially unchanged. The first removal process may utilize an anisotropic etch (e.g., anisotropic plasma dry etching). In other embodiments, the first removal process may be or comprise chemical wet etching, ashing, and/or high temperature cleaning solutions (e.g., sulfuric acid peroxide mixture (SPM)). The first removal process may be substantially selective to removal of the sacrificial layer (1802 of FIG. 19) because the sacrificial layer (1802 of FIG. 19) comprises a different material than the continuous liner layer 1902 and the spacer structure 126.

In some embodiments, the method proceeds from FIG. 20 to FIG. 25, thereby skipping the steps illustrated in FIGS. 21-24. In other embodiments, the method proceeds from FIG. 20 to FIG. 21.

Figure 21:
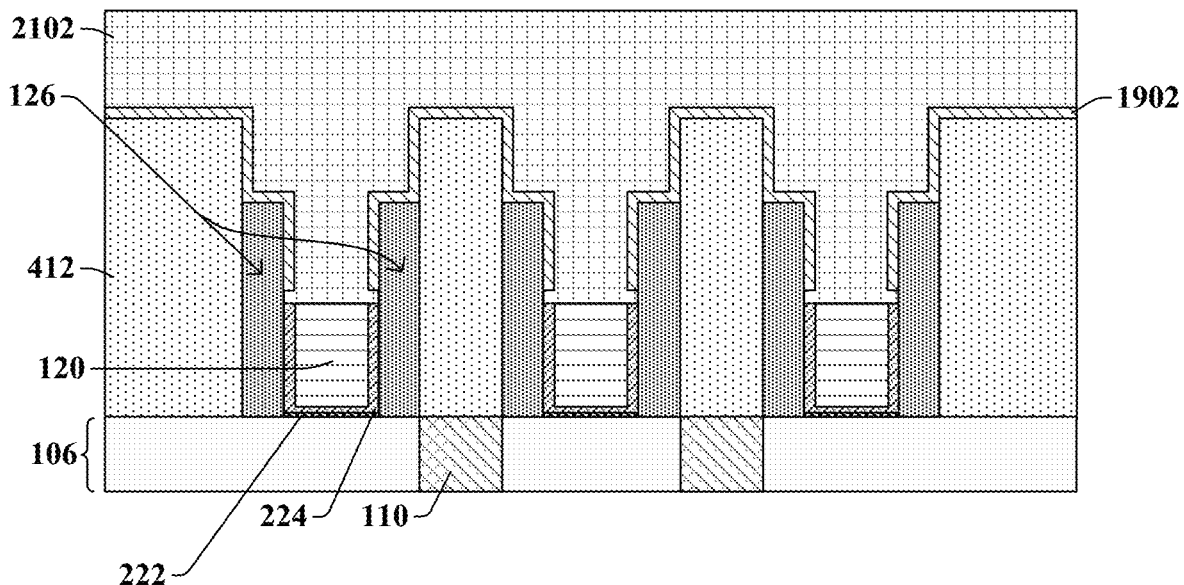

As illustrated in cross-sectional view 2100 of FIG. 21, in some embodiments, a liner hard mask material 2102 is formed over the continuous liner layer 1902. The liner hard mask material 2102 may, in some embodiments, completely cover the continuous liner layer 1902. In some embodiments, the liner hard mask material 2102 may be deposited by way of a deposition process (e.g., CVD, PVD, PE-CVD, ALD, etc.).

Figure 22:
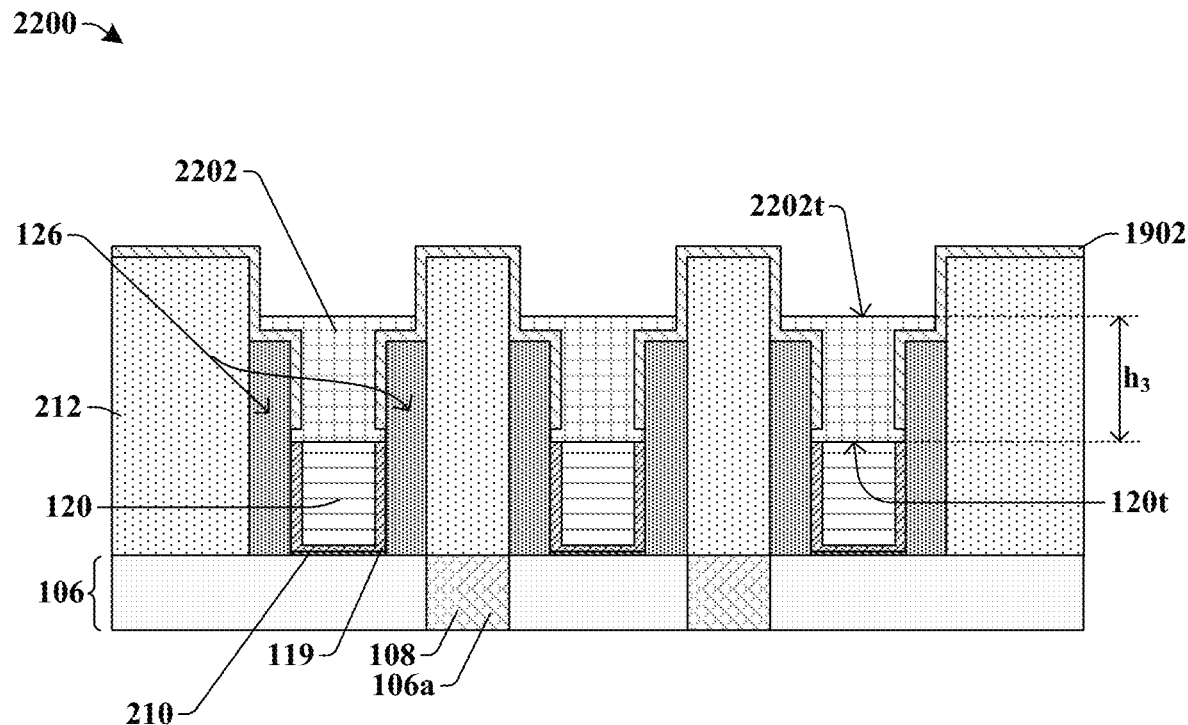

As illustrated in cross-sectional view 2200 of FIG. 22, a liner hard mask etchback may be performed to remove portions of the liner hard mask material (2102 of FIG. 21) to form a liner hard mask structure 2202 over the gate electrode 120. The liner hard mask etchback may be performed such that the liner hard mask structure 2202 has a topmost surface 2202t at a third height $h_3$ measured in the vertical direction from the topmost surface 120t of the gate electrode 120. In some embodiments, the liner hard mask etchback may be conducted using a removal (e.g., etching) process that selectively removes the liner hard mask material (2102 of FIG. 21), while the continuous liner layer 1902 may remain substantially unchanged.

Figure 23:
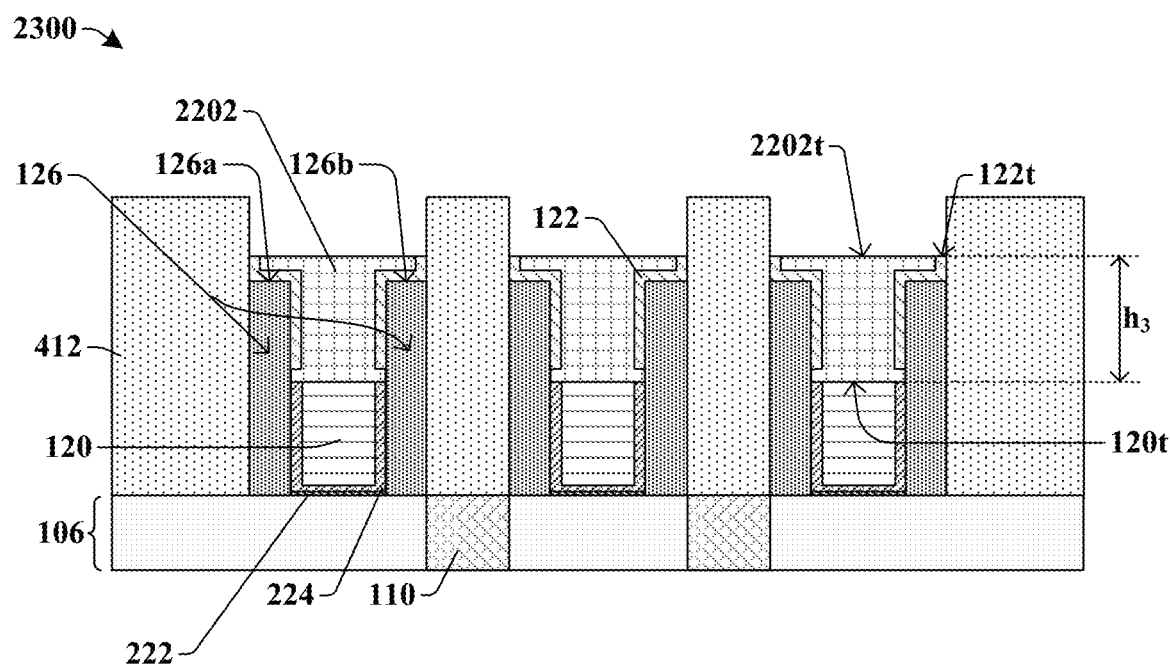

As shown in cross-sectional view 2300 of FIG. 23, a liner etchback may be performed to remove portions of the continuous liner layer (1902 of FIG. 22) that are above the topmost surface 2202t of the liner hard mask structure 2202 to form a liner layer 122 arranged between the liner hard mask structure 2202 and the gate electrode 120. After the liner etchback, the liner layer 122 may have a topmost surface 122t that is also at the third height $h_3$ as measured from the topmost surface 120t of the gate electrode 120 in the vertical direction. In some embodiments, the liner etchback may be conducted using a removal (e.g., etching) process that selectively removes the continuous liner layer (1902 of FIG. 22), while the first dielectric layer 412 and/or liner hard mask structure 2202 remains substantially unchanged.

In some embodiments, the third height $h_3$ is below the first and second topmost surfaces 126a, 126b of the spacer structure 126. In such embodiments, the spacer structure 126 may become damaged (e.g., spacer loss or defects by ion bombardment) from the liner etchback as the liner etchback removes the continuous liner layer (1902 of FIG. 22) from the first and second topmost surfaces 126a, 126b of the spacer structure 126.

Figure 24:
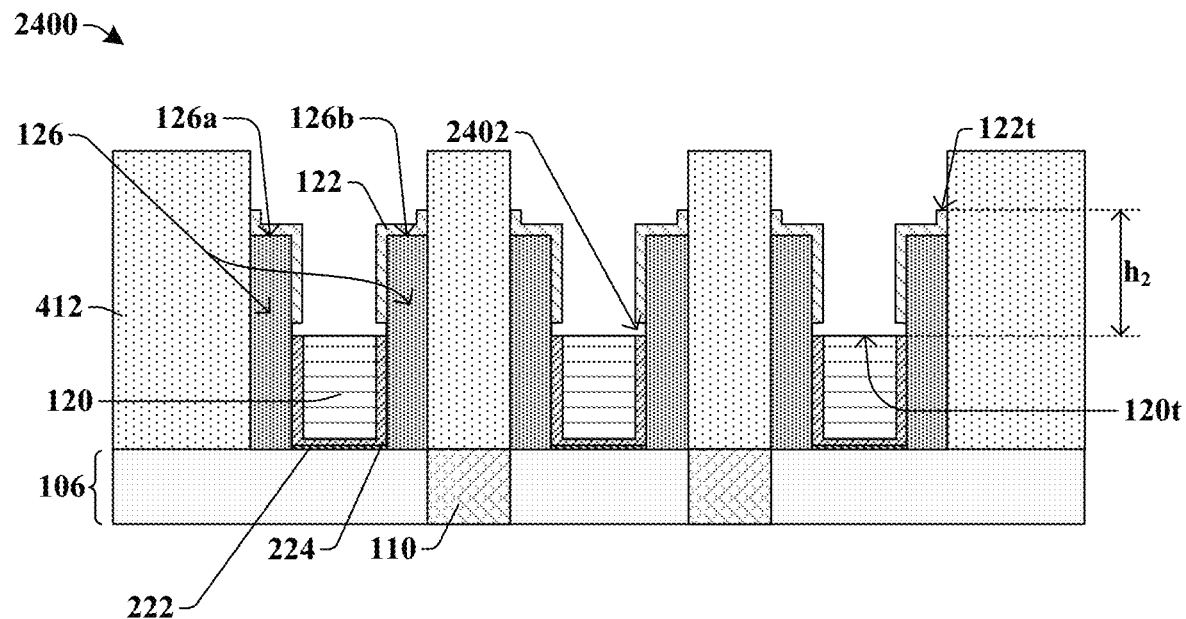

As shown in cross-sectional view 2400 of FIG. 24, the liner hard mask structure (2202 of FIG. 23) may be removed. In some embodiments, the liner hard mask structure (2202 of FIG. 23) is removed by a wet etchant. After the removal of the liner hard mask structure (2202 of FIG. 23), a space 2402 may be arranged between the liner layer 122 such that the liner layer 122 does not directly contact the gate electrode 120.

In some embodiments, the liner hard mask structure (2202 of FIG. 23) may be used to control the design of the liner layer 122. For example, in some embodiments, the liner layer 122 may have a topmost surface 122t that is above the first and second topmost surfaces 126a, 126b of the spacer structure 126, as illustrated in FIG. 24. The topmost surface 122t of the liner layer 122 may be at a second height $h_2$ measured from the topmost surface 120t of the gate electrode 120. In some embodiments, the second height $h_2$ of the liner layer 122 equals the third height $h_3$ of the liner hard mask structure (2202 of FIG. 24). In such embodiments, the liner layer 122 completely covers the first and second topmost surfaces 126a, 126b of the spacer structure 126. In other embodiments, the liner layer 122 (and the liner hard mask structure 2202 of FIG. 23) may have a topmost surface 122t that is about even with or below the first and second topmost surfaces 126a, 126b of the spacer structure 126. In such embodiments, the liner layer 122 may not cover the first and second topmost surfaces 126a, 126b of the spacer structure 126. Although reducing the height of the liner layer 122 may reduce the capacitance of the overall device, the liner layer 122 may be less protective of the spacer structure 126 when the liner layer 122 does not cover the first and second topmost surfaces 126a, 126b of the spacer structure 126.

In yet other embodiments, the steps in FIGS. 21-24 are skipped, and the topmost surface 122t of the liner layer 122 is still arranged over the first dielectric layer 412 as illustrated in the cross-sectional view 2000 of FIG. 20. In such embodiments, manufacturing time may be reduced but capacitance in the final device due to excess liner layer 122 may be at increased risk.

Figure 25:
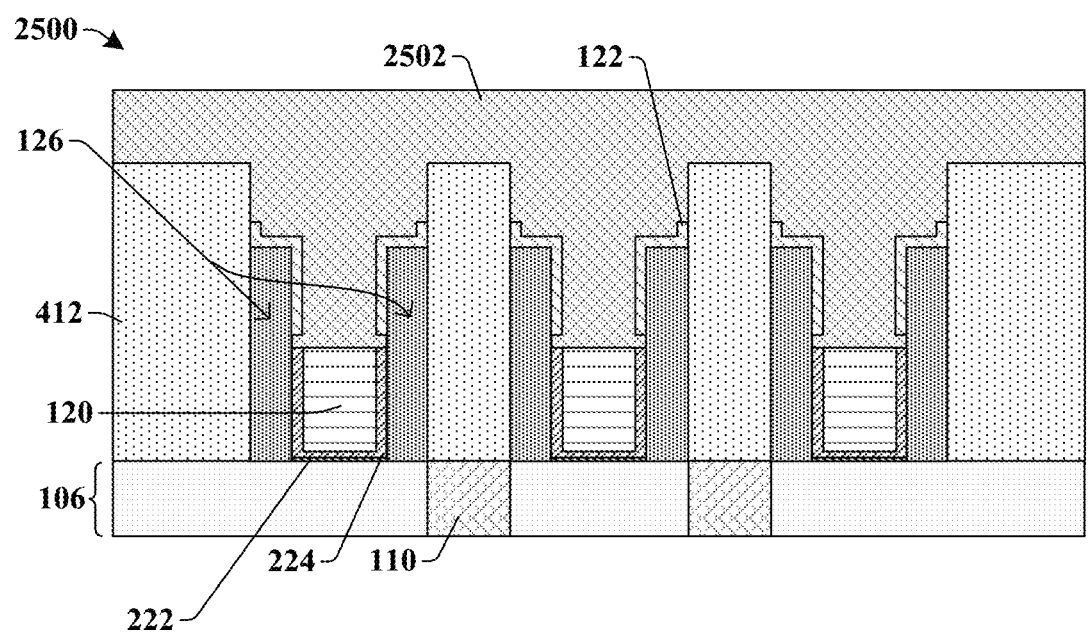

As shown in cross-sectional view 2500 of FIG. 25, in some embodiments, a via hard mask material 2502 is arranged over the liner layer 122 and the first dielectric layer 412. In some embodiments, the via hard mask material 2502 comprises a different material than the liner layer 122. In some embodiments, the via hard mask material 2502 comprises, for example, a low-k dielectric material such as silicon oxide, silicon oxygen carbide, tantalum carbon nitride, silicon nitride, silicon oxygen carbon nitride, silicon, zirconium nitride, or silicon carbon nitride. In other embodiments, the via hard mask material 2502 comprises multiple layers of materials. The via hard mask material 2502 may be deposited by way of a deposition process (e.g., CVD, PVD, PE-CVD, ALD, etc.).

Figure 26:
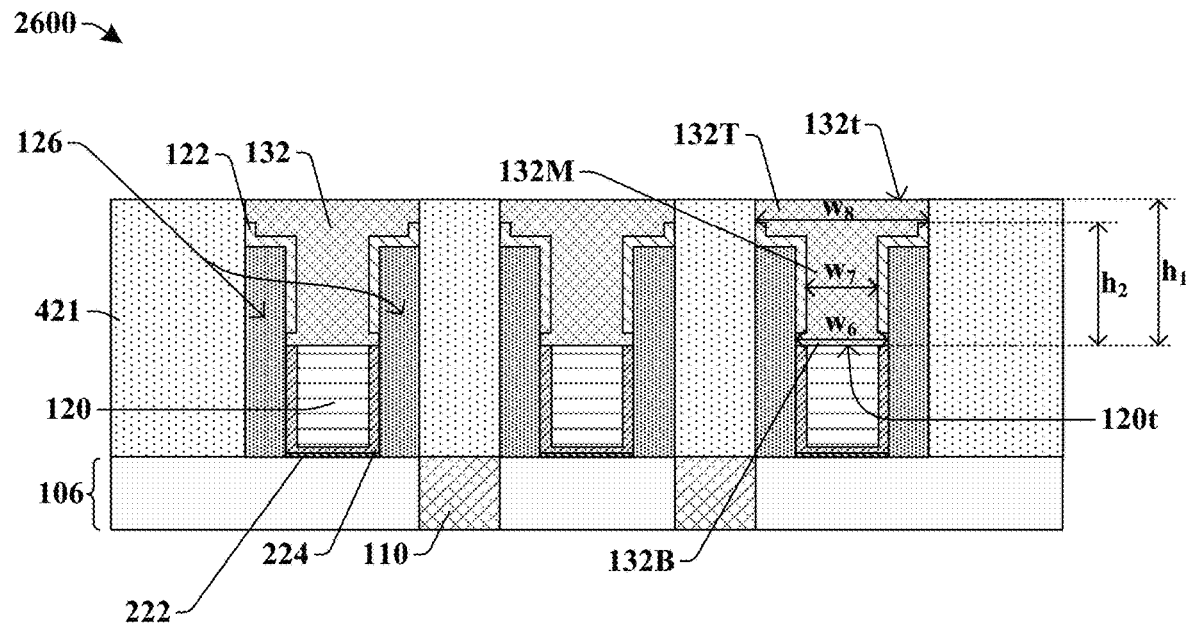

As shown in cross-sectional view 2600 of FIG. 26, in some embodiments, a planarization process (e.g., chemical mechanical planarization (CMP)) is performed to remove portions of the via hard mask material (2502 of FIG. 25) arranged over the first dielectric layer 412 to form a first hard mask structure 132. After the planarization process, in some embodiments, the first dielectric layer 412 and the first hard mask structure 132 may have substantially co-planar upper surfaces. Further, in other embodiments where the steps in FIGS. 22-25 are skipped, the planarization process may also remove portions of the continuous liner layer (1902 of FIG. 22) that are arranged over the first dielectric layer 412. In such embodiments, after the planarization process, the topmost surface 122t of the liner layer 122 may also be substantially co-planar with an upper surface of the first hard mask structure 132.

In some embodiments, the first hard mask structure 132 has a topmost surface 132t at a first height $h_1$ measured in the vertical direction from the topmost surface 120t of the gate electrode 120. In some embodiments, a ratio between the second height $h_2$ of the liner layer 122 to the first height $h_1$ of the first hard mask structure 132 may be in a range of between, for example, approximately 10 percent and approximately 100 percent. In some embodiments, the first height $h_1$ is in a range of between approximately 10 nanometers and approximately 50 nanometers.

In some embodiments, the first hard mask structure 132 comprises a bottom portion 132B, a middle portion 132M and a top portion 132T, which may comprise different or same materials as one another. In some embodiments, the bottom portion 132B of the first hard mask structure 132 has a sixth width $w_6$ in a range of between, for example, approximately 5 nanometers and approximately 30 nanometers. In some embodiments, the middle portion 132M of the first hard mask structure 132 has a seventh width $w_7$ in a range of between, for example, approximately 5 nanometers and approximately 30 nanometers. In some embodiments, the top portion 132T of the first hard mask structure 132 has an eighth width $w_8$ in a range of between, for example, approximately 5 nanometers and approximately 30 nanometers. In some embodiments, the sixth width $w_6$ is greater than the seventh width $w_7$, and the eighth width $w_8$ is greater than the seventh width $w_7$.

Figure 27:
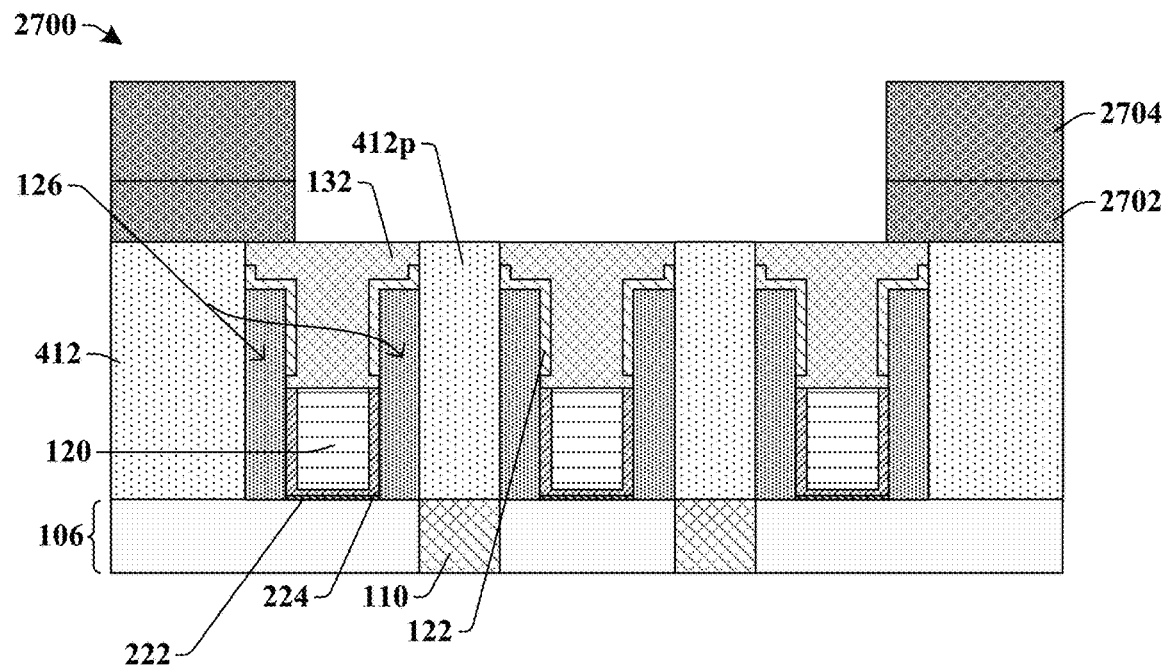

As shown in cross-sectional view 2700 of FIG. 27, in some embodiments, a first masking structure 2702 and a second masking structure 2704 may be formed over the first dielectric layer 412, such that the portion 412p of the first dielectric layer 412 overlying the source/drain region 110 is exposed by an opening in the first and second masking structures 2702, 2704. In other embodiments, only the first masking structure 2702 is arranged over the first dielectric layer 412. The first and second masking structures 2702, 2704 may be formed through photolithography and removal (e.g., etching) processes. In some embodiments, the first and/or second masking structures 2702, 2704 are hard masks.

Figure 28:
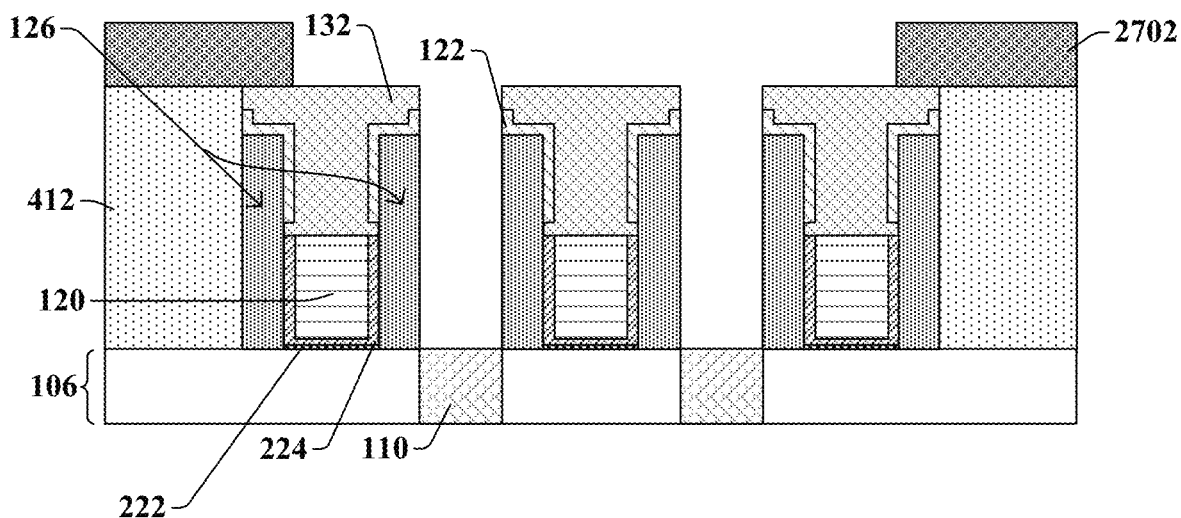

As shown in cross-sectional view 2800 of FIG. 28, the portion (412p of FIG. 27) of the first dielectric layer 412 may be removed to expose the source/drain region 110. In some embodiments, the portion (412p of FIG. 27) of the first dielectric layer 412 may be removed by an etching (e.g., wet etch, dry etch) process, and the spacer structure 126 and/or the first hard mask structure 132 may remain substantially unchanged during the removal of the portion (412p of FIG. 27) of the first dielectric layer 412. In some embodiments, the second masking structure (2704 of FIG. 27) may also be removed during the removal of the portion (412p of FIG. 27) of the first dielectric layer 412. In some embodiments, the first masking structure 2702 remains, whereas in other embodiments, the first masking structure 2702 is also removed during the removal of the portion (412p of FIG. 27) of the first dielectric layer 412.

Figure 29:
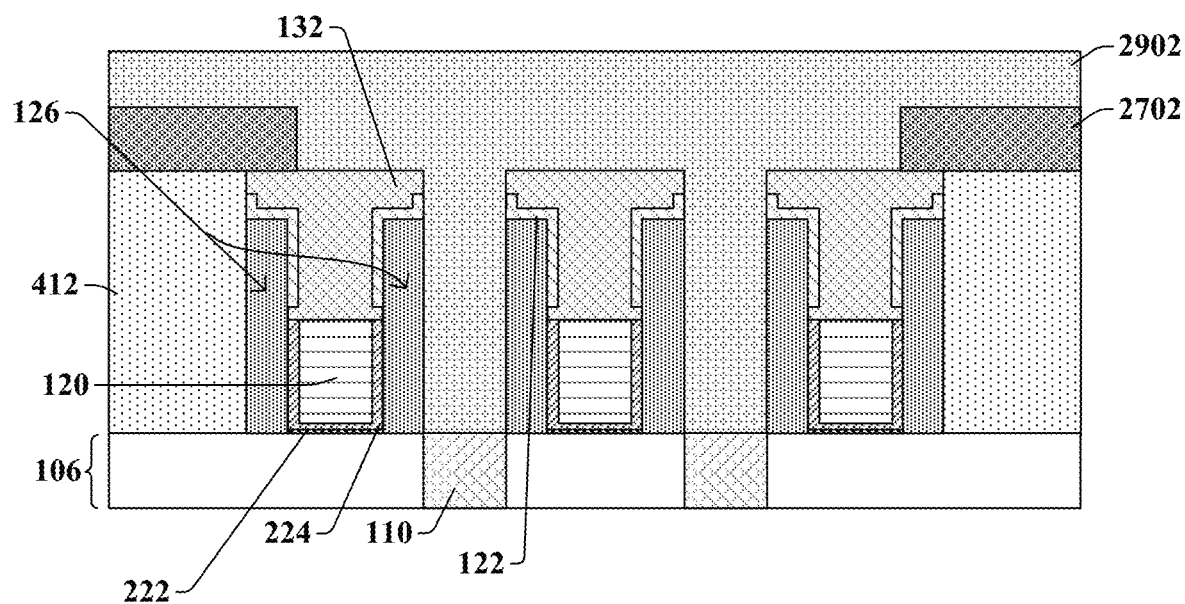

As shown in cross-sectional view 2900 of FIG. 29, a first conductive material 2902 is deposited over the substrate 106 and contacts the source/drain region 110. In some embodiments (not shown), a silicide layer (212 of FIG. 2) is formed on the source/drain region 110 prior to deposition of the first conductive material 2902. In some embodiments, the first conductive material 2902 may be deposited by way of a deposition process (e.g., physical vapor deposition (PVD), chemical vapor deposition (CVD), PE-CVD, atomic layer deposition (ALD), sputtering, etc.). In some embodiments, the first conductive material 2902 may comprise, for example, tungsten, ruthenium, cobalt, copper, titanium, titanium nitride, tantalum, tantalum nitride, molybdenum, nickel, or a combination thereof.

Figure 30:
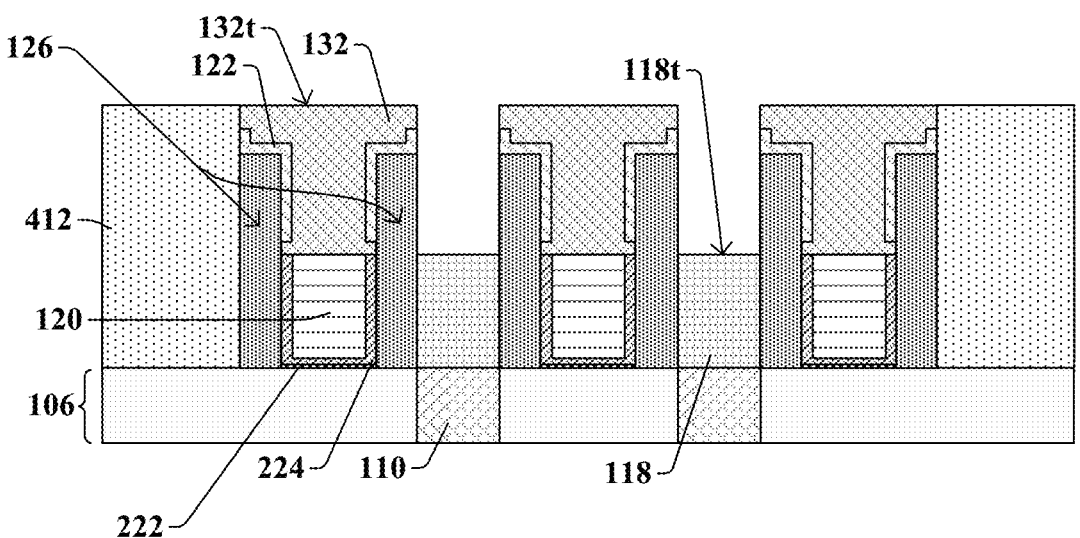

As shown in cross-sectional view 3000 of FIG. 30, upper portions of the first conductive material (2902 of FIG. 29) that overlie the first dielectric layer 412 may be removed to form a contact layer 118 arranged over the source/drain region 110. The contact layer 118 may have a topmost surface 118t arranged below the topmost surface 132t of the first hard mask structure 132. In some embodiments, the upper portions of the first conductive material (2902 of FIG. 29) may be removed by a planarization process (e.g., CMP) and/or an etching process. In some embodiments, the first masking structure (2702 of FIG. 29) may also be removed by the planarization process and/or the etching process.

Figure 31:
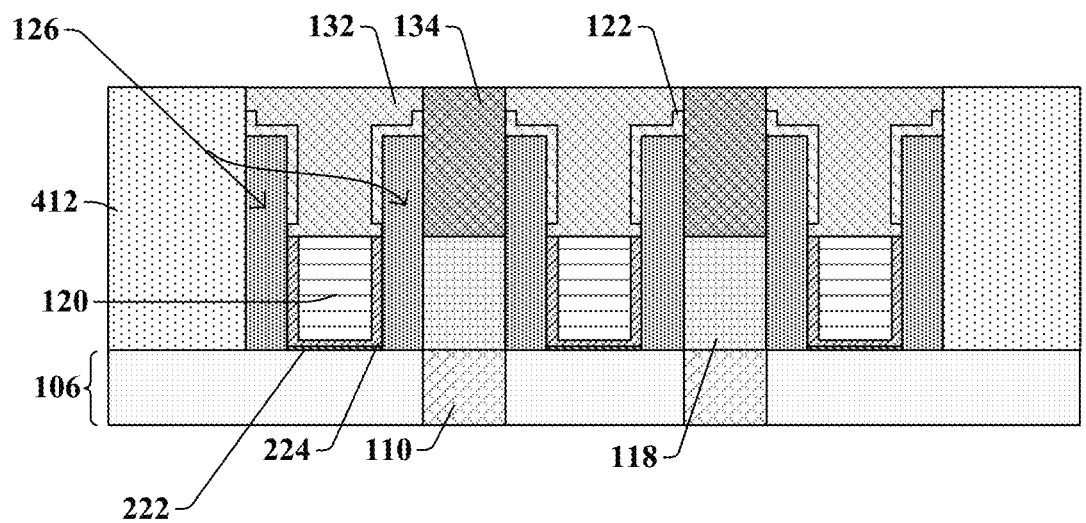

As shown in cross-sectional view 3100 of FIG. 31, a second hard mask structure 134 is formed over the contact layer 118. The second hard mask structure 134 may be formed by way of a deposition process (e.g., physical vapor deposition (PVD), chemical vapor deposition (CVD), PE-CVD, atomic layer deposition (ALD), sputtering, etc.) and subsequent removal process(es) (e.g., CMP, etching, etc.). In some embodiments, the second hard mask structure 134 comprises, for example, a low-k dielectric material such as silicon oxide, silicon oxygen carbide, tantalum carbon nitride, silicon nitride, silicon oxygen carbon nitride, silicon, zirconium nitride, or silicon carbon nitride. In other embodiments, the second hard mask structure 134 comprises multiple layers of materials. Thus, in some embodiments, the second hard mask structure 134 may comprise the same materials as the first hard mask structure 132. In other embodiments, the second hard mask structure 134 comprises different materials than the first hard mask structure 132. In some embodiments, the liner layer 122 separates the first hard mask structure 132 from the second hard mask structure 134.

Figure 32:
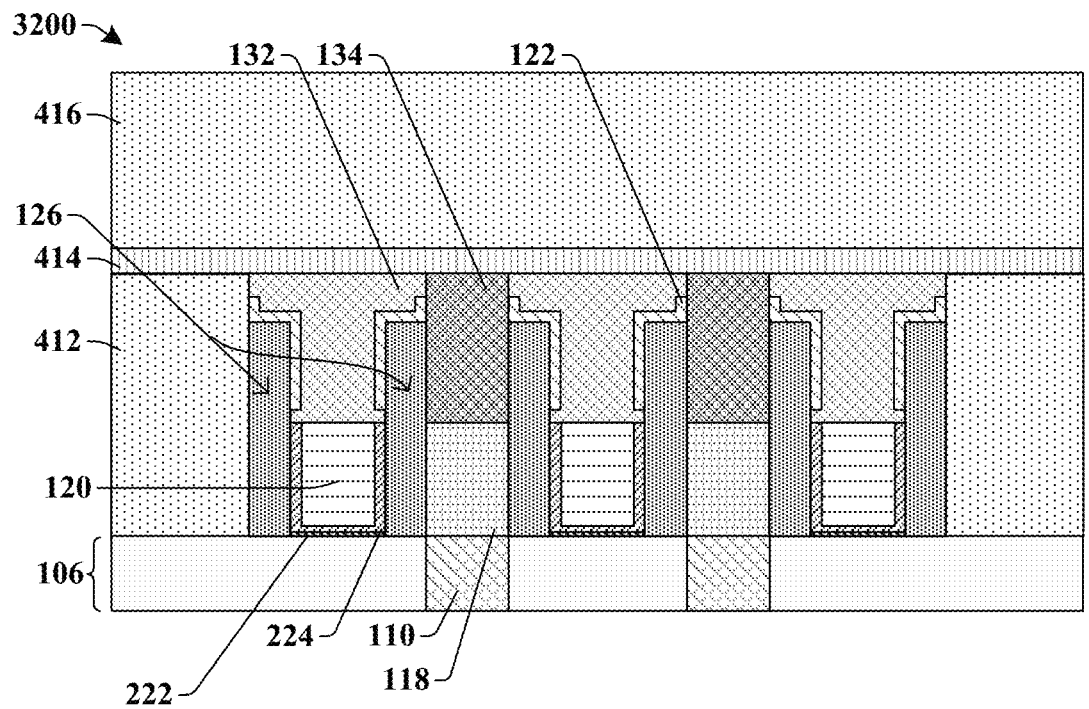

As shown in cross-sectional view 3200 of FIG. 32, in some embodiments, an etch stop layer 414 is deposited over the first dielectric layer 412, the first hard mask structure 132, and the second hard mask structure 134, and a second dielectric layer 416 is deposited over the etch stop layer 414. In some embodiments, the etch stop layer 414 may comprise, for example, silicon oxide, hafnium silicon, silicon oxygen carbide, aluminum oxygen, zirconium silicon, aluminum oxygen nitride, zirconium oxide, tantalum oxide, lanthanum oxide, yttrium oxide, tantalum carbon nitride, silicon nitride, silicon oxygen carbon nitride, silicon, zirconium nitride, silicon carbon nitride, or the like. In some embodiments, the etch stop layer 414 may have a thickness measured in the vertical direction in a range of between approximately 1 nanometer and approximately 30 nanometers. Further, in some embodiments, the second dielectric layer 416 may comprise, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. The etch stop layer 414 and the second dielectric layer 416 may each be deposited by way of a deposition process (e.g., CVD, PVD, PE-CVD, ALD, etc.).

Figure 33:
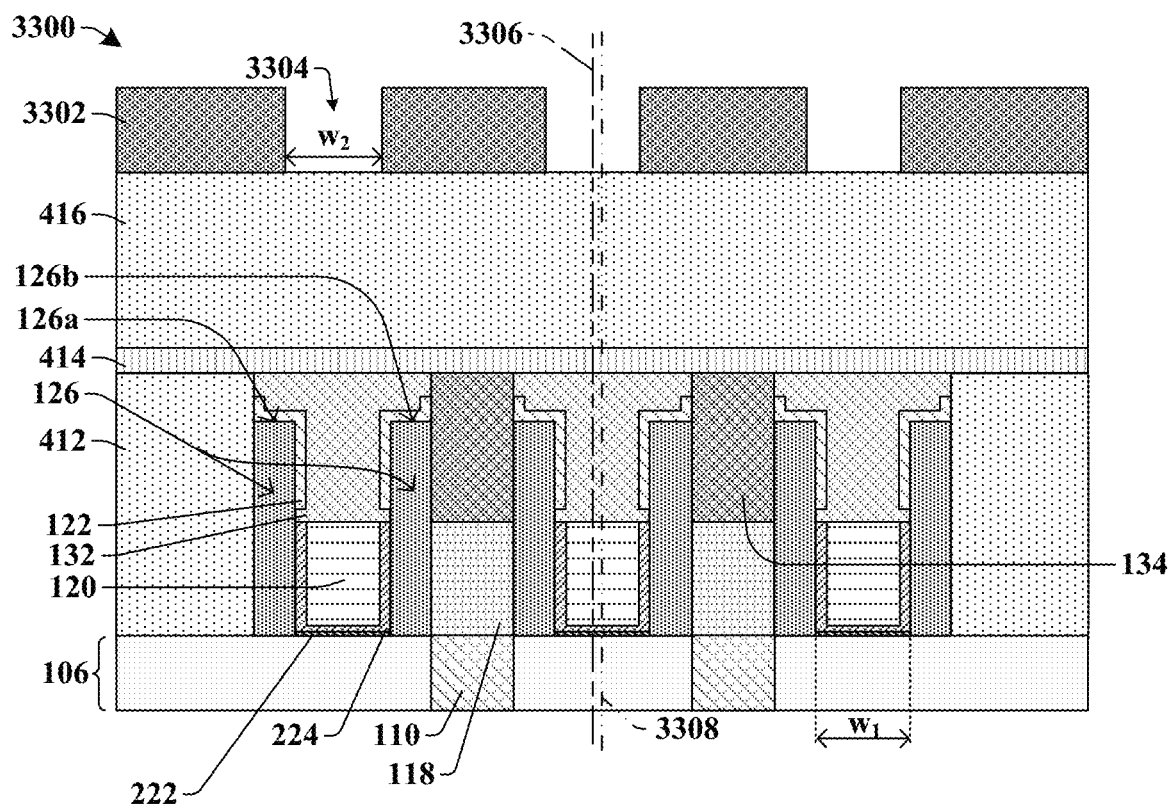

As shown in cross-sectional view 3300 of FIG. 33, a third masking structure 3302 may be formed over the second dielectric layer 416. The third masking structure 3302 may comprise a first opening 3304 arranged over the gate electrode 120. The third masking structure 3302 may be formed by way of photolithography and removal (e.g., etching) processes. In some embodiments, the first opening 3304 may have a second width $w_2$ measured in the lateral direction. In some embodiments, the first width $w_1$ of the gate electrode 120 may equal the second width $w_2$ of the first opening 3304. However, in some embodiments, the first opening 3304 may not "land centered" over the gate electrode 120, and thus, the first opening 3304 may directly overlie the spacer structure 126. For example, in some embodiments during the formation of the third masking structure 3302, a first center line 3306 which is arranged at the center of the first opening 3304 and runs in the vertical direction may not be collinear with a second center line 3308 which is arranged at the center of the gate electrode 120 and runs in the vertical direction. In other embodiments, the third masking structure 3302 and the first opening 3304 may "land centered" over the gate electrode 120, and thus, the first and second center lines 3306, 3308 would be collinear. In yet other embodiments, the second width $w_2$ may be greater than the first width $w_1$, and thus, even if the first and second center lines 3306, 3308 were collinear, the first opening 3304 would still directly overlie the spacer structure 126. In some embodiments, the second width $w_2$ is in a range of between, for example, approximately 1 nanometer and approximately 50 nanometers.

Figure 34:
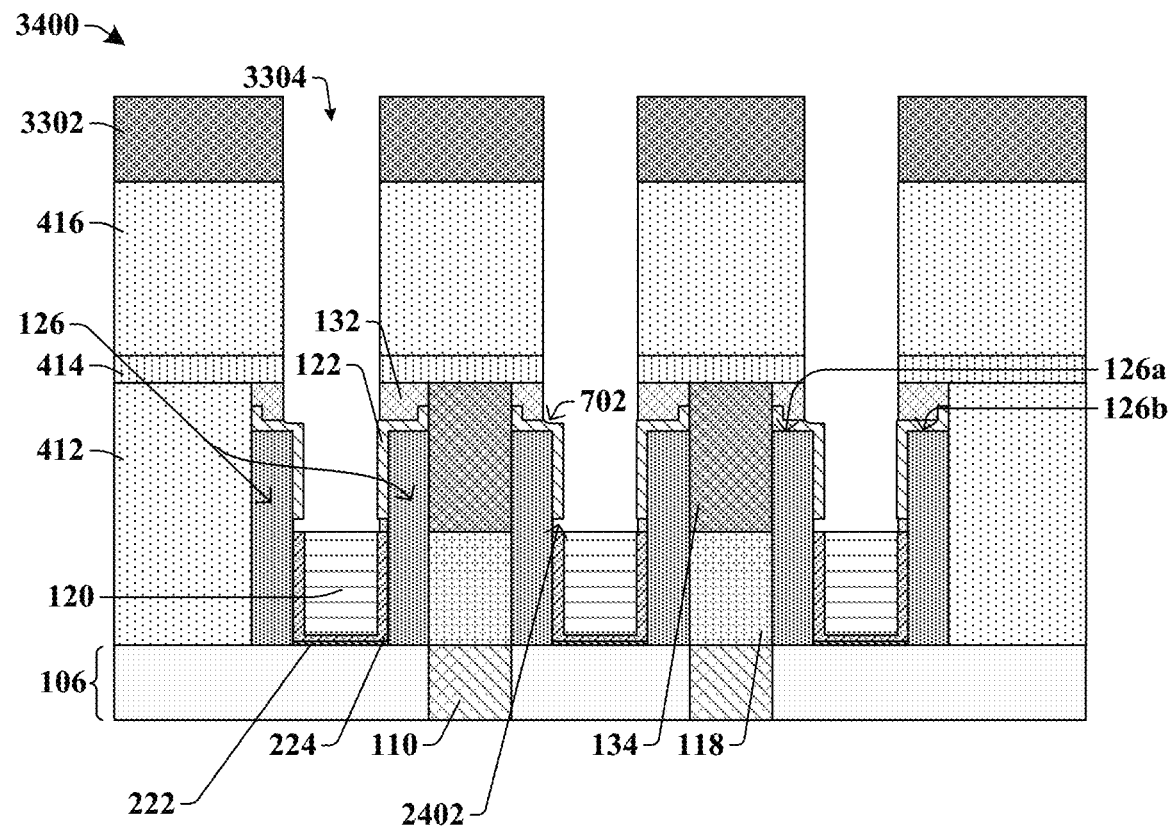

As shown in cross-sectional view 3400 of FIG. 34, a first etching process is performed according to the first opening 3304 in the third masking structure 3302 to remove portions of the second dielectric layer 416, the etch stop layer 414, and the first hard mask structure 132 that directly underlie the first opening 3304 to expose the gate electrode 120. In some embodiments, the first etching process may comprise multiple etchants, whereas in other embodiments, one etchant may sufficiently remove each material of the second dielectric layer 416, the etch stop layer 414, and the first hard mask structure 132. A first etchant may be used to remove the first hard mask structure 132, and the material(s) of the first hard mask structure 132 have a higher rate of removal by the first etchant than the material of the liner layer 122. Thus, in some embodiments, because the liner layer 122 comprises a different material than the first hard mask structure 132, the liner layer 122 is resistant to removal by the first etchant, or at least is removed at a slower rate than the first hard mask structure 132.

In some embodiments, some of the liner layer 122 that is exposed to the first etchant may be removed or damaged such that the portion 702 of the liner layer 122 is thinned or has an increased surface roughness, for example, after the first etching process. In some embodiments, the first etchant is a vertical etch, and thus vertical portions of the liner layer 122 may be substantially unaffected by the first etchant. In other embodiments, the first etchant may be partially isotropic to remove the first hard mask structure 132 arranged between the liner layer 122 and the gate electrode 120, leaving the space 2402 after the first etching process. In other embodiments, a second etchant different than the first etchant may be used after the first etchant to target and remove the first hard mask structure 132 arranged between the liner layer 122 and the gate electrode 120. Further, in some embodiments (not shown), a portion of the spacer structure 126 arranged directly beside the space 2402 between the liner layer 122 and the gate electrode 120 may be partially removed or become damaged during the first etching process upon removing the first hard mask structure 132 arranged directly between the liner layer 122 and the gate electrode 120.

In some embodiments, the liner layer 122 covers the first and second topmost surfaces 126a, 126b of the spacer structure 126, and the liner layer 122 does not get fully removed by the first etchant. Therefore, in such embodiments, the spacer structure 126 may not be exposed to the first etchant, and loss of the spacer structure 126 is prevented. In such embodiments, the spacer structure 126 may have a substantially uniform thickness throughout its height after the first etching process. In some other embodiments, even though the liner layer 122 may cover the first and second topmost surfaces 126a, 126b of the spacer structure 126, the liner layer 122 may be removed by the first etchant. However, the liner layer 122 delays the exposure of the first etchant on the spacer structure 126, and thus, because of the liner layer 122, loss of the spacer structure 126 by the first etchant is mitigated. In yet other embodiments, the liner layer 122 may not cover the first and second topmost surfaces 126a, 126b of the spacer structure 126, and thus, portions of the spacer structure 126 may be removed during the first etching process.

Further, the first etching process does not need to fully remove any portions of the liner layer 122, because the sacrificial layer (1802 of FIG. 18) prevented the liner layer 122 from covering the gate electrode 120. Thus, the first etching process may comprise etchants that do not remove the material of the liner layer 122, thereby increasing protection of the spacer structure 126 by the liner layer 122.

Figure 35:
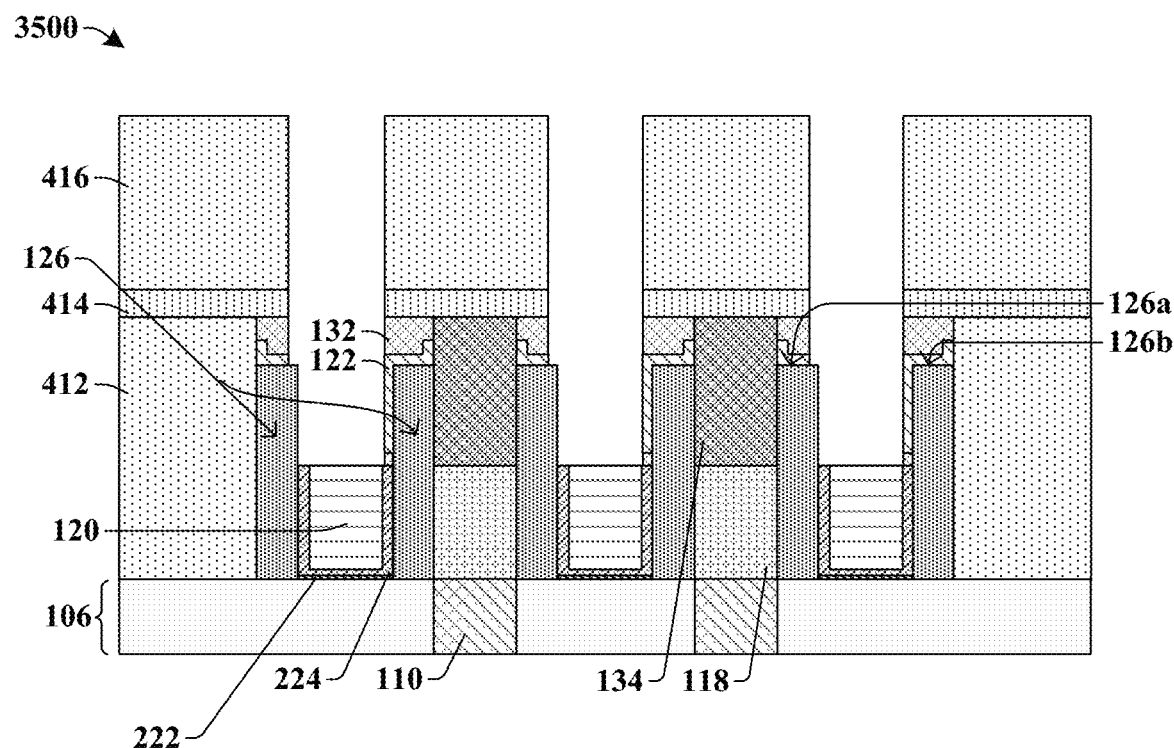

In some embodiments, the method proceeds from FIG. 34 to FIG. 35 to remove portions of the liner layer 122 uncovered by the first hard mask structure 132. In other embodiments, the aforementioned portions of the liner layer 122 may remain in the final design, and thus, the method may proceed from FIG. 34 to FIG. 36, thereby skipping the step(s) in FIG. 34.

As shown in cross-sectional view 3500 of FIG. 35, in some embodiments, a second etching process is performed to remove portions of the liner layer 122 from FIG. 34 that were uncovered by the first hard mask structure 132. In some embodiments, the third masking structure (3302 of FIG. 34) is also removed during the second etching process. In other embodiments, the third masking structure (3302 of FIG. 34) may be removed in later processing steps. In some embodiments, the second etching process uses a third etchant that is different than the first etchant and selectively removes the liner layer 122 without removing the spacer structure 126. Advantages of removing the portions of the liner layer 122 uncovered by the first hard mask structure 132 include reducing the capacitance of the final device. However, manufacturing times and cost are increased. Thus, in some other embodiments, the second etching process may be omitted from the method.

Figure 36:
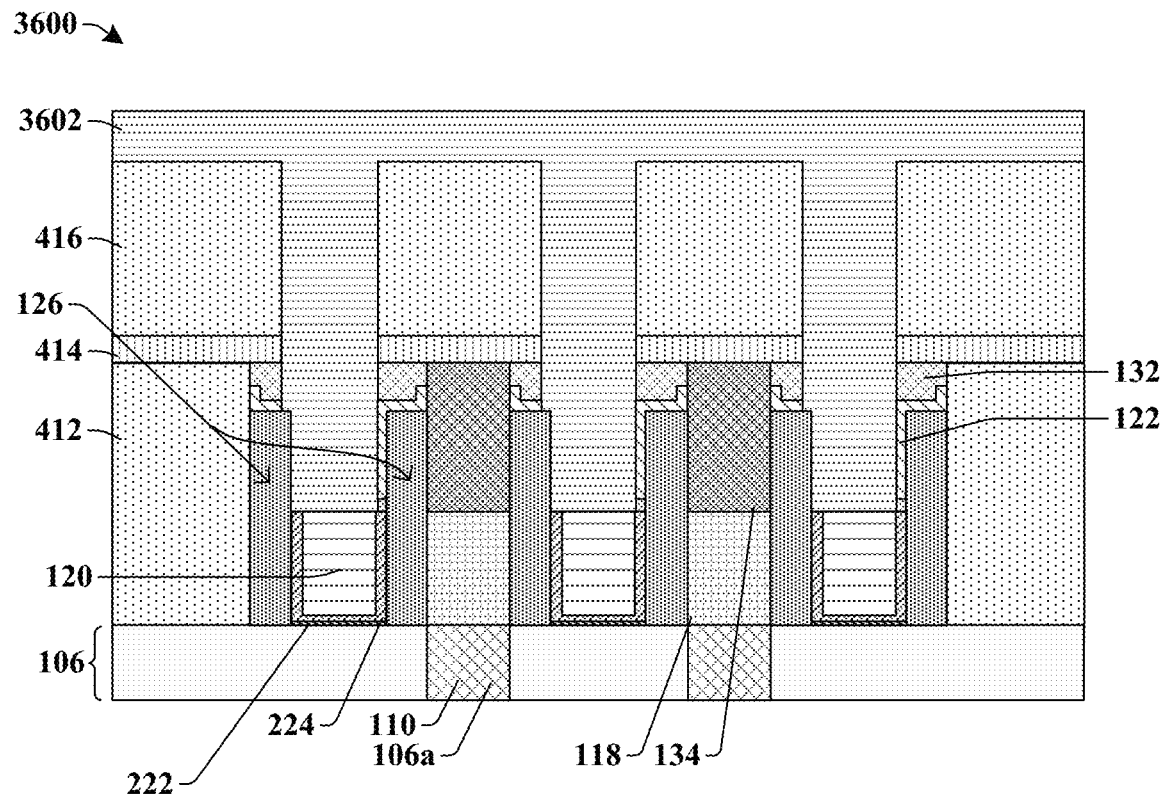

As shown in cross-sectional view 3600 of FIG. 36, a conductive material 3602 may be formed over the second dielectric layer 416 and over the gate electrode 120. In some embodiments, before forming the conductive material 3602, the third masking structure (3302 of FIG. 34) may be removed. In other embodiments, the third masking structure (3302 of FIG. 34) may remain present during the forming of the conductive material 3602. In some embodiments, the conductive material 3602 may comprise, for example, tungsten, ruthenium, cobalt, copper, titanium, titanium nitride, tantalum, tantalum nitride, molybdenum, nickel, or a combination thereof. In some embodiments, the conductive material 3602 may be deposited by way of a deposition process (e.g., physical vapor deposition (PVD), chemical vapor deposition (CVD), PE-CVD, atomic layer deposition (ALD), sputtering, etc.).

Figure 37:
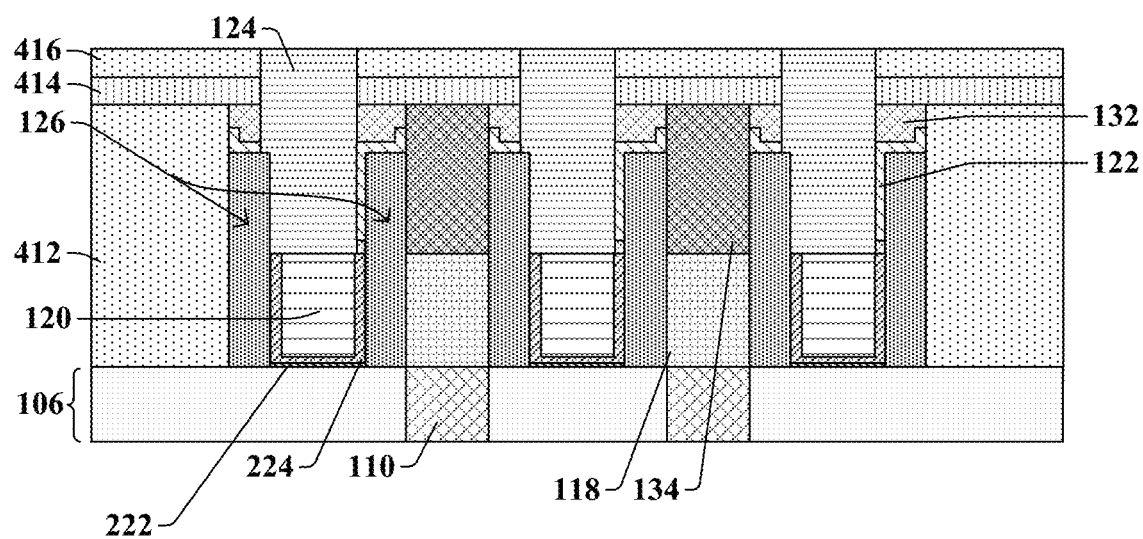

As shown in cross-sectional view 3700 of FIG. 37, a planarization process (e.g., CMP) may be performed to remove portions of the conductive material (3602 of FIG. 36) arranged over the second dielectric layer 416 to form a contact via 124 directly contacting the gate electrode 120. Further, in some embodiments, the planarization process (e.g., CMP) may remove portions of the second dielectric layer 416. In other embodiments, the planarization process (e.g., CMP) may completely remove the second dielectric layer 416, thereby exposing the etch stop layer 414. In some embodiments, after the planarization process (e.g., CMP), upper surfaces of the contact via 124 and the second dielectric layer 416 are substantially co-planar. Although the contact via 124 may not "land centered" over the gate electrode 120, the liner layer 122 protects the spacer structure 126 to provide sufficient isolation between the contact layer 118 and the gate electrode 120 and the contact via 124, thereby increasing reliability of the final device.

It will be appreciated that in some embodiments, the method illustrated in FIGS. 16-37 may be adjusted to form a contact via 124 over the contact layer 118 using a liner layer 122 to form the structure illustrated in FIG. 3, for example. In such embodiments, the liner layer 122 may still reduce the amount of loss from the spacer structure 126 such that the spacer structure 126 effectively isolates the contact via 124 and the contact layer 118 from the gate electrode 120.

Figure 38:
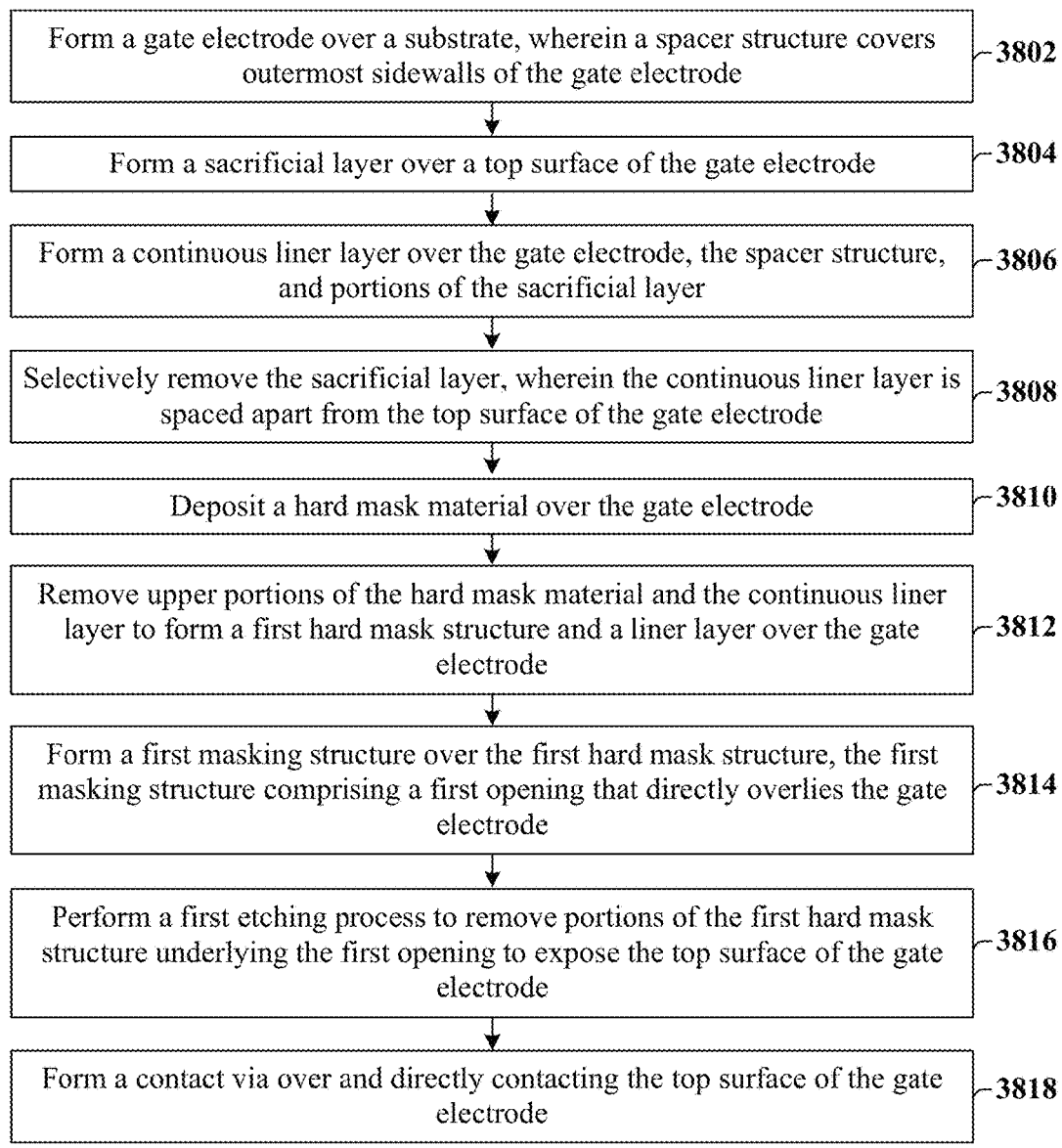
FIG. 38 illustrates a flow diagram of some embodiments of a method corresponding to FIGS. 16-37.

FIG. 38 illustrates a flow diagram of some embodiments of a method 3800 of forming an integrated chip having a liner layer arranged between a spacer structure and a first hard mask structure.

While method 3800 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 3802, a gate electrode is formed over a substrate, and a spacer structure covers outermost sidewalls of the gate electrode. FIG. 17 illustrates cross-sectional view 1700 of some embodiments corresponding to act 3802.

At act 3804, a sacrificial layer is formed over a top surface of the gate electrode. FIG. 18 illustrates cross-sectional view 1800 of some embodiments corresponding to act 3804.

At act 3806, a continuous liner layer is formed over the gate electrode, the spacer structure, and portions of the sacrificial layer. FIG. 19 illustrates cross-sectional view 1900 of some embodiments corresponding to act 3806.

At act 3808, the sacrificial layer is selectively removed, and the continuous liner layer is spaced apart from the top surface of the gate electrode. FIG. 20 illustrates cross-sectional view 2000 of some embodiments corresponding to act 3808.

At act 3810 a hard mask material is deposited over the gate electrode. FIG. 25 illustrates cross-sectional view 2500 of some embodiments corresponding to act 3810.

At act 3812, upper portions of the hard mask material and the continuous liner layer are removed to form a first hard mask structure and a liner layer over the gate electrode. FIG. 26 illustrates cross-sectional view 2600 of some embodiments corresponding to act 3812.

At act 3814, a first masking structure is formed over the first hard mask structure, the first masking structure comprising a first opening that directly overlies the gate electrode. FIG. 33 illustrates cross-sectional view 3300 of some embodiments corresponding to act 3814.

At act 3816, a first etching process is performed to remove portions of the first hard mask structure underlying the first opening to expose the top surface of the gate electrode. FIG. 34 illustrates cross-sectional view 3400 of some embodiments corresponding to act 3816.

At act 3818, a contact via is formed over the top surface of the gate electrode and directly contacts the top surface of the gate electrode. FIG. 37 illustrates cross-sectional view 3700 of some embodiments corresponding to act 3818.

Therefore, the present disclosure relates to a method of forming a contact via over a gate electrode surrounded by a spacer structure, wherein a liner layer mitigates loss of the spacer structure during the contact via formation.

Accordingly, in some embodiments, the present disclosure relates to an integrated chip comprising: a substrate; a gate electrode overlying the substrate; a contact layer overlying the substrate and laterally spaced from the gate electrode; a spacer structure surrounding outermost sidewalls of the gate electrode and separating the gate electrode from the contact layer; a hard mask structure arranged over the gate electrode and between portions of the spacer structure; a contact via extending through the hard mask structure and contacting the gate electrode; and a liner layer arranged directly between the hard mask structure and the spacer structure, wherein the liner layer is spaced apart from the gate electrode.

In other embodiments, the present disclosure relates to an integrated chip comprising: a substrate comprising a source/drain region; a contact layer arranged over the source/drain region; a gate electrode arranged over the substrate and laterally spared from the contact layer; a hard mask structure arranged over the gate electrode; a contact via extending through the hard mask structure and arranged over and directly contacting an upper surface of the gate electrode; a spacer structure arranged directly between the gate electrode and the contact layer; and a liner layer contacting inner sidewalls of the spacer structure, wherein the liner layer comprises a material with a higher dielectric constant than a material of the spacer structure.

In yet other embodiments, the present disclosure relates to a method of forming an integrated chip comprising: forming a gate electrode over a substrate, wherein a spacer structure surrounds outermost sidewalls of the gate electrode; forming a sacrificial layer over a top surface of the gate electrode; forming a continuous liner layer over upper surfaces and inner sidewalls of the spacer structure, wherein the continuous liner layer is spaced apart from the gate electrode by the sacrificial layer; performing a first removal process to selectively remove the sacrificial layer; depositing a hard mask material over the gate electrode; removing upper portions of the hard mask material and the continuous liner layer to form a hard mask structure separated and a liner layer over the gate electrode; forming a first masking structure over the hard mask structure, the first masking structure comprising a first opening that directly overlies the gate electrode; performing a first etching process to remove portions of the hard mask structure underlying the first opening to expose the top surface of the gate electrode; and forming a contact via over and directly contacting the top surface of the gate electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip comprising:
   a substrate;
   a gate electrode overlying the substrate;
   a contact layer overlying the substrate and laterally spaced from the gate electrode;
   a spacer structure surrounding outermost sidewalls of the gate electrode and separating the gate electrode from the contact layer;
   a hard mask structure arranged over the gate electrode;
   a contact via extending through the hard mask structure and contacting the gate electrode; and
   a liner layer arranged directly between the hard mask structure and the spacer structure, wherein the contact via has a bottommost surface that has a larger width than a part of the contact via that is directly between sidewalls of the liner layer.

2. The integrated chip of claim 1, wherein the liner layer comprises a material having a higher dielectric constant than a material of the spacer structure.

3. The integrated chip of claim 1, wherein the contact via is directly and vertically between a bottommost surface of the liner layer and a top surface of the gate electrode.

4. The integrated chip of claim 1, wherein a first bottom surface of the liner layer is spaced apart from the gate electrode by the hard mask structure, and wherein a second bottom surface of the liner layer is spaced apart from the gate electrode by the contact via.

5. The integrated chip of claim 1, wherein the contact via has a middle portion arranged between and directly contacting inner sidewalls of the liner layer, wherein the contact via has a bottom portion arranged between and directly contacting inner sidewalls of the spacer structure, wherein the middle portion has a first width, wherein the bottom portion has a second width, and wherein the first width is less than the second width.

6. The integrated chip of claim 1, wherein the contact via directly overlies a first portion of the spacer structure.

7. The integrated chip of claim 6, wherein the first portion of the spacer structure has a varying thickness throughout its height, and wherein a topmost surface of the first portion of the spacer structure is thinner than a bottommost surface of the first portion of the spacer structure.

8. An integrated chip comprising:
a substrate comprising a source/drain region;
a contact layer arranged over the source/drain region;
a gate electrode arranged over the substrate and laterally spaced from the contact layer;
a hard mask structure arranged over the gate electrode;
a contact via extending through the hard mask structure and arranged over and directly contacting an upper surface of the gate electrode;
a spacer structure arranged directly between the gate electrode and the contact layer; and
a liner layer contacting inner sidewalls of the spacer structure, wherein the liner layer comprises a material with a higher dielectric constant than a material of the spacer structure.

9. The integrated chip of claim 8, wherein the material of the liner layer has a higher dielectric constant than a material of the hard mask structure.

10. The integrated chip of claim 8, wherein the liner layer has a first portion arranged on a first side of the contact via and a second portion arranged on a second side of the contact via, and wherein the first portion is completely spaced apart from the second portion.

11. The integrated chip of claim 10, wherein the first portion of the liner layer has a first bottom surface spaced apart from the gate electrode by the contact via.

12. The integrated chip of claim 10, wherein the second portion of the liner layer has a bottom surface that is completely spaced apart from the gate electrode by the hard mask structure.

13. The integrated chip of claim 10, wherein the contact via directly separates the first and second portions of the liner layer from the gate electrode.

14. The integrated chip of claim 8, wherein the contact via directly contacts a first topmost surface of the spacer structure, and wherein the spacer structure has a thickness that is substantially uniform throughout its height.

15. An integrated chip comprising:
a substrate;
a gate electrode overlying the substrate;
a contact layer overlying the substrate and laterally spaced from the gate electrode;
a spacer structure surrounding outermost sidewalls of the gate electrode and separating the gate electrode from the contact layer;
a hard mask structure arranged over the gate electrode and between portions of the spacer structure; and
a liner layer arranged directly between the hard mask structure and the spacer structure, wherein a bottommost surface of the hard mask structure is arranged below a bottommost surface of the liner layer.

16. The integrated chip of claim 15, wherein the liner layer comprises a material with a higher dielectric constant than a material of the spacer structure.

17. The integrated chip of claim 15, wherein the hard mask structure separates the bottommost surface of the liner layer from the gate electrode.

18. The integrated chip of claim 15, further comprising:
a contact via extending through the hard mask structure and arranged over and directly contacting an upper surface of the gate electrode.

19. The integrated chip of claim 18, wherein the contact via separates the bottommost surface of the liner layer from the upper surface of the gate electrode.

20. The integrated chip of claim 18, wherein the contact via directly contacts the spacer structure.

* * * * *